US012444338B2

(12) United States Patent
Wang et al.

(10) Patent No.: US 12,444,338 B2
(45) Date of Patent: Oct. 14, 2025

(54) PIXEL CIRCUIT AND DRIVING METHOD THEREOF, DISPLAY SUBSTRATE, AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Gang Wang, Beijing (CN); Kai Zhang, Beijing (CN); Xinyu Wei, Beijing (CN); Xingrui Cai, Beijing (CN); Qiang Fu, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/548,974

(22) PCT Filed: Jul. 13, 2022

(86) PCT No.: PCT/CN2022/105457
§ 371 (c)(1),
(2) Date: Sep. 5, 2023

(87) PCT Pub. No.: WO2023/005669
PCT Pub. Date: Feb. 2, 2023

(65) Prior Publication Data

US 2024/0185794 A1 Jun. 6, 2024

(30) Foreign Application Priority Data

Jul. 30, 2021 (WO) ................ PCT/CN2021/109894
Aug. 5, 2021 (CN) ........................ 202110898582.X

(51) Int. Cl.
*G09G 3/20* (2006.01)
*G09G 3/3225* (2016.01)
(Continued)

(52) U.S. Cl.
CPC ......... *G09G 3/2007* (2013.01); *G09G 3/3225* (2013.01); *G09G 3/3233* (2013.01);
(Continued)

(58) Field of Classification Search
CPC .. G09G 3/3233; G09G 3/3266; G09G 3/3291; G09G 3/3258; G09G 3/3225;
(Continued)

(56) References Cited

U.S. PATENT DOCUMENTS 9,691,348 B2 6/2017 Kim et al.
2002/0089291 A1 7/2002 Kaneko
(Continued)

FOREIGN PATENT DOCUMENTS

CN 1435805 A 8/2003
CN 102654975 A 9/2012
(Continued)

OTHER PUBLICATIONS

First Office Action for Chinese Application No. 202180002066.2, dated Nov. 23, 2022, 13 Pages.
(Continued)

*Primary Examiner* — Benjamin C Lee
(74) *Attorney, Agent, or Firm* — BROOKS KUSHMAN P.C.

(57) ABSTRACT

A pixel circuit and a driving method thereof, a display substrate, and a display device are provided. In the pixel circuit, a data writing circuit is configured to control a connection between a data line and a second terminal of a driving circuit under control of a first scanning signal provided by a first scanning line; a reset circuit is configured
(Continued)

to control a connection between a reset voltage line and the second terminal of the driving circuit under control of a third scanning signal provided by a third scanning line; or the reset circuit is coupled to the third scanning line, the reset voltage line and a first terminal of the driving circuit, and is configured to control a connection between the reset voltage line and the first terminal of the driving circuit under control of the third scanning signal.

10 Claims, 36 Drawing Sheets

(51) Int. Cl.
*G09G 3/3233* (2016.01)
*G09G 3/3258* (2016.01)
*H10K 59/131* (2023.01)

(52) U.S. Cl.
CPC ......... *G09G 3/3258* (2013.01); *H10K 59/131* (2023.02); *G09G 2300/0408* (2013.01); *G09G 2300/0426* (2013.01); *G09G 2300/0819* (2013.01); *G09G 2300/0842* (2013.01); *G09G 2300/0852* (2013.01); *G09G 2300/0861* (2013.01); *G09G 2310/0254* (2013.01); *G09G 2310/061* (2013.01); *G09G 2310/08* (2013.01); *G09G 2320/0233* (2013.01); *G09G 2320/0247* (2013.01); *G09G 2320/0252* (2013.01); *G09G 2320/0257* (2013.01); *G09G 2320/045* (2013.01); *G09G 2320/0626* (2013.01)

(58) Field of Classification Search
CPC .. G09G 3/30; G09G 3/20; G09G 3/32; G09G 3/3208; G09G 3/3275; G09G 2300/0819; G09G 2300/0842; G09G 2300/0861; G09G 2300/0852; G09G 2300/0426; G09G 2300/043; G09G 2300/0866; G09G 2300/0809; G09G 2320/043; G09G 2320/0233; G09G 2320/045; G09G 2320/0295; G09G 2310/08; G09G 2310/0251; G09G 2310/0262; G09G 2310/0286; G09G 2310/061; G09G 2330/021; G09G 3/2074; G09G 2310/0254; G09G 2310/251; G09G 2310/262; G09G 2320/0247; G09G 2320/0252; G09G 2320/0257; G09G 2320/0626
See application file for complete search history.

(56) References Cited

U.S. PATENT DOCUMENTS

2003/0142052 A1 7/2003 Matsumoto
2009/0251496 A1* 10/2009 Saito .................... G09G 3/3283 345/690
2010/0141644 A1 6/2010 Lee et al.
2012/0147060 A1* 6/2012 Jeong ................... G09G 3/3233 345/82
2013/0057532 A1 3/2013 Lee et al.
2013/0127818 A1 5/2013 Tsai et al.
2014/0049568 A1 2/2014 Qi et al.
2015/0054812 A1 2/2015 Jeon
2015/0170576 A1* 6/2015 Bae ...................... G09G 3/3266 345/82
2015/0348466 A1 12/2015 Park et al.
2015/0379930 A1 12/2015 Lee et al.
2016/0012775 A1* 1/2016 Jeong ................. H10K 59/1216 438/34
2016/0078809 A1* 3/2016 Yoon ................... H01L 27/1222 345/78
2017/0162145 A1 6/2017 Huang et al.
2017/0301293 A1 10/2017 Zhu et al.
2017/0358261 A1 12/2017 Zhou
2018/0033370 A1 2/2018 Zheng et al.
2018/0040275 A1 2/2018 Wu
2018/0130410 A1 5/2018 Gao et al.
2018/0158407 A1 6/2018 Chai et al.
2018/0166021 A1 6/2018 Xi et al.
2018/0166025 A1 6/2018 Zhou et al.
2018/0374421 A1 12/2018 Chen et al.
2019/0057646 A1 2/2019 Lin et al.
2019/0189053 A1 6/2019 Kim et al.
2019/0213958 A1* 7/2019 Cho ..................... G09G 3/3266
2019/0221165 A1 7/2019 Park et al.
2019/0237019 A1 8/2019 Gao et al.
2019/0295473 A1 9/2019 Lu et al.
2020/0226978 A1 7/2020 Lin et al.
2020/0372854 A1 11/2020 Nam
2021/0049959 A1 2/2021 Park et al.
2021/0104196 A1 4/2021 Yuan
2021/0118361 A1* 4/2021 Li ........................ G09G 3/3233
2021/0125543 A1 4/2021 Kim et al.
2021/0134219 A1 5/2021 Huang et al.
2021/0134224 A1 5/2021 He et al.
2021/0167161 A1 6/2021 Yang et al.
2021/0225282 A1 7/2021 Cho et al.
2021/0264862 A1 8/2021 Wang
2021/0327344 A1 10/2021 Dong
2021/0327352 A1 10/2021 Zhang et al.
2021/0335260 A1 10/2021 Wang et al.
2021/0375198 A1 12/2021 Zhang et al.
2021/0383743 A1 12/2021 Yuan
2021/0407383 A1 12/2021 Lai et al.
2021/0407386 A1 12/2021 Li et al.
2021/0407390 A1 12/2021 Li et al.
2022/0020330 A1 1/2022 Cao et al.
2022/0148506 A1* 5/2022 Yuan .................... G09G 3/3233
2022/0180811 A1 6/2022 Kim et al.
2022/0223084 A1* 7/2022 Lai ........................... G09G 3/20
2022/0319417 A1 10/2022 Liu et al.
2023/0008643 A1 1/2023 Park et al.
2023/0133704 A1 5/2023 Gai et al.
2023/0360600 A1 11/2023 Wang et al.

FOREIGN PATENT DOCUMENTS

CN 104200771 A 12/2014
CN 104485071 A 4/2015
CN 106558287 A 4/2017
CN 106910460 A 6/2017
CN 107068060 A 8/2017
CN 107256695 A 10/2017
CN 107274830 A 10/2017
CN 107358918 A 11/2017
CN 107492351 A 12/2017
CN 107507568 A 12/2017
CN 107610651 A 1/2018
CN 107665672 A 2/2018
CN 107799062 A 3/2018
CN 207082320 U 3/2018
CN 108133687 A 6/2018
CN 108320710 A 7/2018
CN 108492775 A 9/2018
CN 108538243 A 9/2018
CN 108777127 A 11/2018
CN 108831385 A 11/2018
CN 108877655 A 11/2018
CN 109243369 A 1/2019
CN 109285500 A 1/2019
CN 109599062 A 4/2019
CN 109801592 A 5/2019
CN 109887464 A 6/2019
CN 109949743 A 6/2019
CN 110047428 A 7/2019
CN 110047432 A 7/2019
CN 110070826 A 7/2019
CN 110223636 A 9/2019

(56) References Cited

FOREIGN PATENT DOCUMENTS

| | | | |
|---|---|---|---|
| CN | 111063301 | A | 4/2020 |
| CN | 210348517 | U | 4/2020 |
| CN | 111354307 | A | 6/2020 |
| CN | 111383597 | A | 7/2020 |
| CN | 111402810 | A | 7/2020 |
| CN | 111435587 | A | 7/2020 |
| CN | 111445848 | A | 7/2020 |
| CN | 111445857 | A | 7/2020 |
| CN | 211062442 | U | 7/2020 |
| CN | 111489701 | A | 8/2020 |
| CN | 111613177 | A | 9/2020 |
| CN | 111696484 | A | 9/2020 |
| CN | 111710303 | A | 9/2020 |
| CN | 111754921 | A | 10/2020 |
| CN | 111968564 | A | 11/2020 |
| CN | 111986622 | A | 11/2020 |
| CN | 112102785 | A | 12/2020 |
| CN | 112116890 | A | 12/2020 |
| CN | 112133242 | A | 12/2020 |
| CN | 112397028 | A | 2/2021 |
| CN | 112599099 | A | 4/2021 |
| CN | 112634832 | A | 4/2021 |
| CN | 112735314 | A | 4/2021 |
| CN | 112785958 | A | 5/2021 |
| CN | 112802431 | A | 5/2021 |
| CN | 112908246 | A | 6/2021 |
| CN | 113140179 | A | 7/2021 |
| CN | 113160740 | A | 7/2021 |
| CN | 113851083 | A | 12/2021 |
| CN | 114222615 | A | 3/2022 |
| CN | 114258320 | A | 3/2022 |
| CN | 114514573 | A | 5/2022 |
| JP | 2000221903 | A | 8/2000 |
| JP | 2015132738 | A | 7/2015 |
| KR | 20120064493 | A | 6/2012 |
| KR | 20130026338 | A | 3/2013 |
| KR | 20130055450 | A | 5/2013 |
| KR | 20150064543 | A | 6/2015 |
| KR | 20150073420 | A | 7/2015 |
| KR | 101755440 | B1 | 7/2017 |
| KR | 102118926 | B1 | 6/2020 |
| WO | 2019242557 | A1 | 12/2019 |
| WO | 2020124759 | A1 | 6/2020 |
| WO | 2020258421 | A1 | 12/2020 |
| WO | 2022061852 | A1 | 3/2022 |

OTHER PUBLICATIONS

Second Office Action for Chinese Application No. 202180002066.2, dated Feb. 17, 2023, 14 Pages.

International Search Report and Written Opinion for Application No. PCT/CN2021/109894, dated Apr. 26, 2022, 9 Pages.

International Search Report and Written Opinion for Application No. PCT/CN2021/117473, dated Mar. 28, 2022, 11 Pages.

International Search Report and Written Opinion for Application No. PCT/CN2022/103292, dated Sep. 9, 2022, 13 Pages.

International Search Report and Written Opinion for Application No. PCT/CN2022/105457, dated Sep. 28, 2022, 10 Pages.

International Search Report and Written Opinion for Application No. PCT/CN2022/104654, dated Sep. 21, 2022, 11 Pages.

International Search Report and Written Opinion for Application No. PCT/CN2022/105458, dated Sep. 19, 2022, 11 Pages.

First Non Final Office Action for U.S. Appl. No. 17/794,130, dated Jul. 29, 2024, 31 Pages.

First Non Final Office Action for U.S. Appl. No. 18/014,763, dated Jul. 3, 2024, 49 Pages.

First Non Final Office Action for U.S. Appl. No. 18/273,201, dated May 22, 2024, 28 Pages.

First Office Action for Chinese Application No. 202110897625.2, dated Dec. 20, 2024, 19 Pages.

First Office Action for Chinese Application No. 202110898740.1, dated Dec. 6, 2024, 18 Pages.

* cited by examiner

PIXEL CIRCUIT AND DRIVING METHOD THEREOF, DISPLAY SUBSTRATE, AND DISPLAY DEVICE

CROSS-REFERENCE TO RELATED APPLICATIONS

This application is the U.S. national phase of PCT Application No. PCT/CN2022/105457 filed on Jul. 13, 2022, which claims priority to Chinese Patent Application No. 202110898582.X filed on Aug. 5, 2021, which are incorporated herein by reference in their entireties.

PCT Application No. PCT/CN2022/105457 also claims priority to PCT Application No. PCT/CN2021/109894 filed on Jul. 30, 2021, which is hereby incorporated by reference in its entirety.

TECHNICAL FIELD

The present disclosure relates to the field of displaying technology, and more particularly, to a pixel circuit and a driving method thereof, a display substrate, and a display device.

BACKGROUND

As the AMOLED (Active-Matrix Organic Light-Emitting Diodes) display screen has been widely used in the middle and high-end market, there are higher quality requirements on the AMOLED display screen, as well as a finer design requirement.

In a pixel circuit included in the AMOLED display screen, when a driving transistor operates at a certain bias voltage for a certain time period, the characteristic thereof may shift, namely, a hysteresis phenomenon may occur, which may cause undesirable issues such as a short-term residual image and a slow response.

SUMMARY

The present disclosure is to provide a pixel circuit and a driving method thereof, a display substrate, and a display device.

To achieve this, the present disclosure provides the following technical solutions.

In a first aspect of the present disclosure, a pixel circuit is provided, including a driving circuit, a data writing circuit and a reset circuit;

the data writing circuit is coupled to a first scanning line, a data line and a second terminal of the driving circuit, and the data writing circuit is configured to control a connection between the data line and the second terminal of the driving circuit under control of a first scanning signal provided by the first scanning line;

the reset circuit is coupled to a third scanning line, a reset voltage line and the second terminal of the driving circuit, and the reset circuit is configured to control a connection between the reset voltage line and the second terminal of the driving circuit under control of a third scanning signal provided by the third scanning line; or the reset circuit is coupled to the third scanning line, the reset voltage line and a first terminal of the driving circuit, and the reset circuit is configured to control a connection between the reset voltage line and the first terminal of the driving circuit under control of the third scanning signal; and the driving circuit is configured to control a connection between the first terminal of the driving circuit and the second terminal of the driving circuit under control of a potential of a control terminal of the driving circuit.

Optionally, the pixel circuit further includes: a compensation control circuit, a first initialization circuit, a light-emitting control circuit, an energy storage circuit and a light-emitting element;

the compensation control circuit is electrically connected to a second scanning line, the control terminal of the driving circuit and the first terminal of the driving circuit, and the compensation control circuit is configured to control a connection between the control terminal of the driving circuit and the first terminal of the driving circuit under control of a second scanning signal provided by the second scanning line;

the first initialization circuit is coupled to an initialization control line, a first initialization voltage line and the control terminal of the driving circuit, the first initialization circuit is configured to control a connection between the first initialization voltage line and the control terminal of the driving circuit under control of an initialization control signal provided by the initialization control line;

the light-emitting control circuit is coupled to a light-emitting control line, the first terminal of the driving circuit and the light-emitting element, and the light-emitting control circuit is configured to control a connection between the first terminal of the driving circuit and the light-emitting element under control of a light-emitting control signal provided by the light-emitting control line; and the energy storage circuit is coupled to the control terminal of the driving circuit and the second terminal of the driving circuit.

Optionally, the pixel circuit further includes: a second initialization circuit; and the second initialization circuit is coupled to the third scanning line, a second initialization voltage line and the light-emitting element, and the second initialization circuit is configured to control a connection between the second initialization voltage line and the light-emitting element under control of the third scanning signal.

Optionally, the first initialization voltage line is reused as the reset voltage line.

Optionally, the light-emitting control circuit is further coupled to a first voltage line and the second terminal of the driving circuit, and the light-emitting control circuit is configured to control a connection between the first voltage line and the second terminal of the driving circuit under control of the light-emitting control signal.

Optionally, the compensation control circuit includes a first transistor, the first initialization circuit includes a second transistor, the driving circuit includes a third transistor, and the light-emitting control circuit includes a fifth transistor and a sixth transistor;

a gate electrode of the first transistor is coupled to the second scanning line, a first electrode of the first transistor is coupled to a second electrode of the third transistor, and a second electrode of the first transistor is coupled to a gate electrode of the third transistor;

a gate electrode of the second transistor is coupled to the initialization control line, a first electrode of the second transistor is coupled to the first initialization voltage line, and a second electrode of the second transistor is coupled to the gate electrode of the third transistor;

a gate electrode of the fifth transistor is coupled to the light-emitting control line, a first electrode of the fifth transistor is coupled to the first voltage line, and a second electrode of the fifth transistor is coupled to a first electrode of the third transistor; and a gate electrode of the sixth transistor is coupled to the light-emitting control line, a first electrode of the sixth transistor is coupled to the second electrode of the third transistor, and a second electrode of the sixth transistor is coupled to the light-emitting element.

Optionally, the first transistor and the second transistor are oxide thin-film transistors.

Optionally, the second initialization circuit includes a seventh transistor, a gate electrode of the seventh transistor is coupled to the third scanning line, a first electrode of the seventh transistor is coupled to the second initialization voltage line, and a second electrode of the seventh transistor is coupled to the light-emitting element.

Optionally, the data writing circuit includes a fourth transistor, and the reset circuit includes an eighth transistor;

a gate electrode of the fourth transistor is coupled to the first scanning line, a first electrode of the fourth transistor is coupled to the data line, and a second electrode of the fourth transistor is coupled to the first electrode of the third transistor;

a gate electrode of the eighth transistor is coupled to the third scanning line, a first electrode of the eighth transistor is coupled to the reset voltage line, and a second electrode of the eighth transistor is coupled to the first electrode or the second electrode of the third transistor.

Based on the technical solution of the above-mentioned pixel circuit, in a second aspect of the present disclosure, a driving method is provided, applied to the above-mentioned pixel circuit, wherein a display period includes a write compensation phase and a bias compensation phase, the driving method including:

in the write compensation phase, controlling, by the data writing circuit under control of the first scanning signal, the connection between the data line and the second terminal of the driving circuit; and in the bias compensation phase, controlling, by the reset circuit connection under control of the third scanning signal, the connection between the reset voltage line and the second terminal of the driving circuit; or, controlling, by the reset circuit connection under control of the third scanning signal, the connection between the reset voltage line and the first terminal of the driving circuit.

Optionally, the display period further includes an initialization phase and a light-emitting phase;

in the initialization phase, controlling, by a first initialization circuit in the pixel circuit under control of an initialization control signal, a connection between a first initialization voltage line and the control terminal of the driving circuit;

in the write compensation phase, controlling, by a compensation control circuit in the pixel circuit under control of a second scanning signal, a connection between the control terminal of the driving circuit and the first terminal of the driving circuit; and in the light-emitting phase, controlling, by a light-emitting control circuit in the pixel circuit under control of a light-emitting control signal, a connection between a first voltage line and the second terminal of the driving circuit and a connection between the first terminal of the driving circuit and the light-emitting element, to cause the driving circuit to drive the light-emitting element to emit light.

Optionally, the display period further includes a plurality of light-emitting phases and a plurality of bias compensation phases, the plurality of light-emitting phases and the plurality of bias compensation phases being alternately arranged.

Based on the above-mentioned technical solution of the pixel circuit, in a third aspect of the present disclosure, a display substrate is provided, including a base substrate and a plurality of sub-pixels arranged on the base substrate, wherein the sub-pixel include the above-mentioned pixel circuit; the sub-pixel further including:

a data line, a reset voltage line, a first scanning line and a third scanning line, wherein the data line includes at least a portion extending in a first direction, the first scanning line includes at least a portion extending in a second direction, and the third scanning line includes at least a portion extending in the second direction, the second direction intersects with the first direction;

the data writing circuit is coupled to the first scanning line, the data line and the second terminal of the driving circuit, and the data writing circuit is configured to control a connection between the data line and a second terminal of the driving circuit under control of a first scanning signal provided by the first scanning line; and the reset circuit is coupled to the third scanning line and the reset voltage line, and is coupled to a first terminal of the driving circuit or the second terminal of the driving circuit, the reset circuit is configured to, under control of a third scanning signal provided by the third scanning line, control a connection between the reset voltage line and the second terminal of the driving circuit; or control a connection between the reset voltage line and the first terminal of the driving circuit.

Optionally, the driving circuit includes a third transistor, and the reset circuit includes an eighth transistor;

a gate electrode of the eighth transistor is coupled to the third scanning line, a first electrode of the eighth transistor is coupled to the reset voltage line, and a second electrode of the eighth transistor is coupled to a first electrode of the third transistor;

the reset voltage line includes at least a portion extending in the first direction, and the reset voltage line and the data line are arranged along the second direction; an orthographic projection of the reset voltage line onto the base substrate at least partially overlaps with an orthographic projection of a gate electrode of a drive transistor onto the base substrate.

Optionally, the eighth transistor includes an eighth active layer including at least a portion extending in the first direction;

at least part of an orthographic projection of the eighth active layer onto the base substrate is located between an orthographic projection of the data line onto the base substrate and the orthographic projection of the reset voltage line onto the base substrate; and the orthographic projection of the eighth active layer onto the base substrate and the orthographic projection of the gate electrode of the drive transistor onto the base substrate are arranged along the first direction.

Optionally, the sub-pixel further includes a first conductive connection portion, wherein the first conductive connection portion is coupled to the second electrode of the eighth transistor and the first electrode of the third transistor; and at least part of an orthographic projection of the first conductive connection portion onto the base substrate is located between the orthographic projection of the data line onto the base substrate and the orthographic projection of the reset voltage line onto the base substrate.

Optionally, the driving circuit includes a third transistor, and the reset circuit includes an eighth transistor;

a gate electrode of the eighth transistor is coupled to the third scanning line, a first electrode of the eighth transistor is coupled to the reset voltage line, and a second electrode of the eighth transistor is coupled to a second electrode of the third transistor; and the reset voltage line includes at least a portion extending in the first direction, and the reset voltage line and the data line are arranged along the second direction; an orthographic projection of a gate electrode of a drive transistor onto the base substrate is located between an orthographic projection of the data line onto the base substrate and an orthographic projection of the reset voltage line onto the base substrate.

Optionally, the eighth transistor includes an eighth active layer including at least a portion extending in the first direction; and an orthographic projection of the eighth active layer onto the base substrate at least partially overlaps with the orthographic projection of the reset voltage line onto the base substrate.

Optionally, the sub-pixel further includes a second conductive connection portion, wherein the second conductive connection portion is coupled to the second electrode of the eighth transistor and the second electrode of the third transistor; and an orthographic projection of the second conductive connection portion onto the base substrate at least partially overlaps with the orthographic projection of the reset voltage line onto the base substrate.

Optionally, the sub-pixel further includes: a first initialization voltage line including at least a portion extending in the second direction; and a first initialization voltage line in one of two sub-pixels which are adjacent in the first direction is reused as a reset voltage line in the other one of the two sub-pixels which are adjacent in the first direction.

Based on the technical solution of the above-mentioned display substrate, in a fourth aspect of the present disclosure, a display device is provided including the above-mentioned display substrate.

BRIEF DESCRIPTION OF THE DRAWINGS

The accompanying drawings described here are used to provide a further understanding of the present disclosure, and constitute a part of the present disclosure. Exemplary embodiments of the present disclosure and description thereof are used to explain the present disclosure, and do not constitute improper limitations to the present disclosure. In the drawings.

DETAILED DESCRIPTION

In order to further explain the pixel circuit and the driving method thereof, the display substrate and the display device provided by embodiments of the present disclosure, a detailed description will be given hereinafter with reference to the accompanying drawings.

With reference to FIGS. 1, 2, 3 and 7-9, an embodiment of the present disclosure provides a pixel circuit, including: a driving circuit 11, a data writing circuit 41 and a reset circuit 20.

The data writing circuit 41 is coupled to a first scanning line S1, a data line D1 and a second terminal of the driving circuit 11. The data writing circuit 41 is configured to control, under control of a first scanning signal provided by the first scanning line S1, a connection between the data line D1 and the second terminal of the driving circuit 11.

The reset circuit 20 is coupled to a third scanning line S3, a reset voltage line DR and the second terminal of the driving circuit 11. The reset circuit 20 is configured to control, under control of a third scanning signal provided by the third scanning line S3, a connection between the reset voltage line DR and the second terminal (namely, a second node N2) of the driving circuit 11. Alternatively, the reset circuit 20 is coupled to the third scanning line S3, the reset voltage line DR and a first terminal (namely, a third node N3) of the driving circuit 11. The reset circuit 20 is configured to control, under control of the third scanning signal, a connection between the reset voltage line DR and the first terminal of the driving circuit 11.

The driving circuit 11 is configured to control a connection between the first terminal of the driving circuit 11 and the second terminal of the driving circuit 11 under control of a potential of a control terminal of the driving circuit 11.

Illustratively, the first scanning line S1 is configured to write the first scanning signal, and the data line D1 is configured to write the data signal. The third scanning line S3 is configured to write the third scanning signal. The reset voltage line DR is configured to provide a reset voltage.

Figure 5:
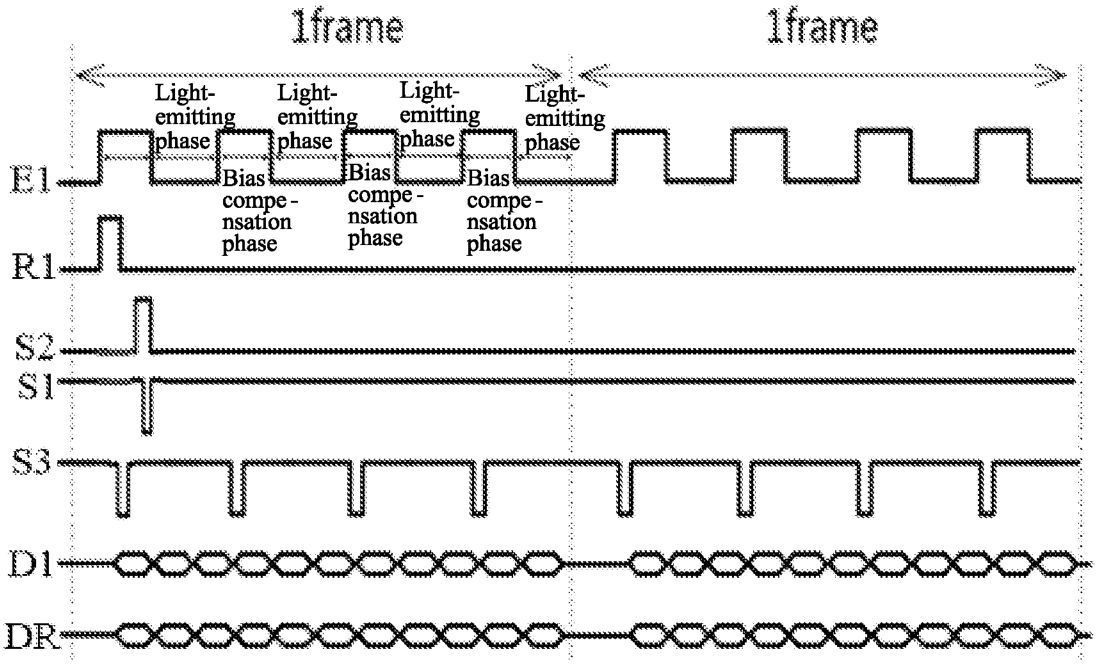
FIG. 5 is a first driving timing sequence diagram of a pixel circuit provided in an embodiment of the present disclosure.
Figure 6:
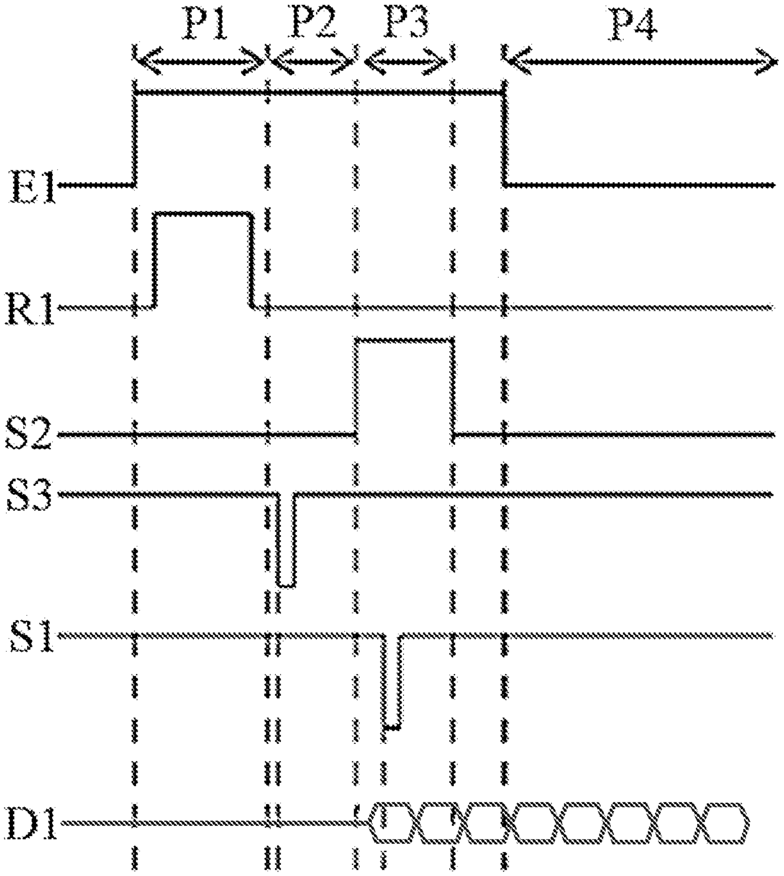
FIG. 6 is a second driving timing sequence diagram for a pixel circuit provided in an embodiment of the present disclosure.

As shown in FIGS. 5 and 6, illustratively, the data signal is used in conventional image displaying. The reset voltage can vary as a change in the data signal. In a bias compensation phase P2, a bias voltage, which has a sign opposite to a sign of a bias voltage in a light-emitting phase P4, is applied to a driving transistor included in the driving circuit 11 For example, in the light-emitting phase P4, the bias voltage Vgs (or Vgd) of the drive transistor is 5 V, and in the compensation phase, the bias voltage of the drive transistor is set to −5 V through the reset voltage line DR.

Illustratively, when the first scanning signal is at an active level, the data writing circuit 41 is configured to electrically connect the data line D1 to the second terminal of the driving circuit 11 under control of the first scanning signal provided by the first scanning line S1. When the first scanning signal is at a non-active level, the data writing circuit 41 is configured to disconnect the electrical connection between the data line D1 and the second terminal of the driving circuit 11 under control of the first scanning signal provided by the first scanning line S1.

Illustratively, when the third scanning signal is at an active level, the reset circuit 20 is configured to electrically connect the reset voltage line DR to the second terminal of the driving circuit 11 or to the first terminal of the driving circuit 11 under control of the third scanning signal. When the third scanning signal is at a non-active level, the reset circuit 20 is configured to disconnect the electrical connection between the second terminal of the driving circuit 11 or the first terminal of the driving circuit 11 and the reset voltage line DR under control of the third scanning signal.

Illustratively, a display period, during which the pixel circuit operates, includes a write compensation phase P3 and a bias compensation phase P2.

In the write compensation phase P3, under control of the first scanning signal, the data writing circuit 41 controls the connection between the data line D1 and the second terminal of the driving circuit 11 to write the data signal to the second terminal of the driving circuit 11.

In the bias compensation phase P2, under control of the third scanning signal, the reset circuit 20 controls the connection between the reset voltage line DR and the second terminal of the driving circuit 11; or under control of the third scanning signal, the reset circuit 20 controls the connection between the reset voltage line DR and the first terminal of the driving circuit 11. As a result, a reset voltage is written to the first terminal or the second terminal of the driving circuit 11.

According to the specific structure of the above-mentioned pixel circuit, it can be seen that in the pixel circuit provided in the embodiment of the present disclosure, by providing the reset circuit 20, a bias voltage with a sign, which is opposite to the sign of bias voltage applied in the light-emitting phase P4, can be applied to the driving circuit 11 during the bias compensation phase P2, so as to compensate for the characteristics shift of the driving circuit 11 occurred when the driving circuit 11 operates at a certain bias voltage for a certain time period, thereby improving defects such as the short-term residual image and the slow response. Moreover, when driving at a low frequency, a luminance difference caused by the characteristic shift of the driving circuit 11 during a long-time light-emitting phase can be compensated, thereby improving the Flicker phenomenon.

In addition, when the pixel circuit provided in the embodiments of the present disclosure is applied to a display substrate, a bias compensation specific to a driving circuit 11 in each of pixel circuits of the display substrate can be performed, thereby achieving a good compensation effect.

Furthermore, since the reset voltage provided by the reset voltage line DR can be adjusted independently, an appropriate bias voltage can be provided to each of pixel circuits in the display substrate as required.

As shown in FIGS. 2, 3, and 7-9, in some embodiments, the pixel circuit further includes: a compensation control circuit 13, a first initialization circuit 14, a light-emitting control circuit 31, an energy storage circuit 42 and a light-emitting element O1.

The compensation control circuit 13 is electrically connected to a second scanning line S2, the control terminal (namely, a first node N1) of the driving circuit 11 and the first terminal (namely, a third node N3) of the driving circuit 11. The compensation control circuit 13 is configured to control a connection between the control terminal of the driving circuit 11 and the first terminal of the driving circuit 11 under control of a second scanning signal provided by the second scanning line S2.

The first initialization circuit 14 is coupled to an initialization control line R1, a first initialization voltage line Vinit1 and the control terminal of the driving circuit 11. The first initialization circuit 14 is configured to control a connection between the first initialization voltage line Vinit1 and the control terminal of the driving circuit 11 under control of an initialization control signal provided by the initialization control line R1.

The light-emitting control circuit 31 is coupled to a light-emitting control line E1, the first terminal of the driving circuit 11 and the light-emitting element 1. The light-emitting control circuit 31 is configured to control a connection between the first terminal of the driving circuit 11 and the light-emitting element O1 under control of a light-emitting control signal provided by the light-emitting control line E1.

The energy storage circuit 42 is coupled to the control terminal of the driving circuit 11 and the second terminal of the driving circuit 11.

Illustratively, each display period in which the pixel circuit operates includes: an initialization phase P1, a bias compensation phase P2, a write compensation phase P3 and a light-emitting phase P4.

Figure 4:
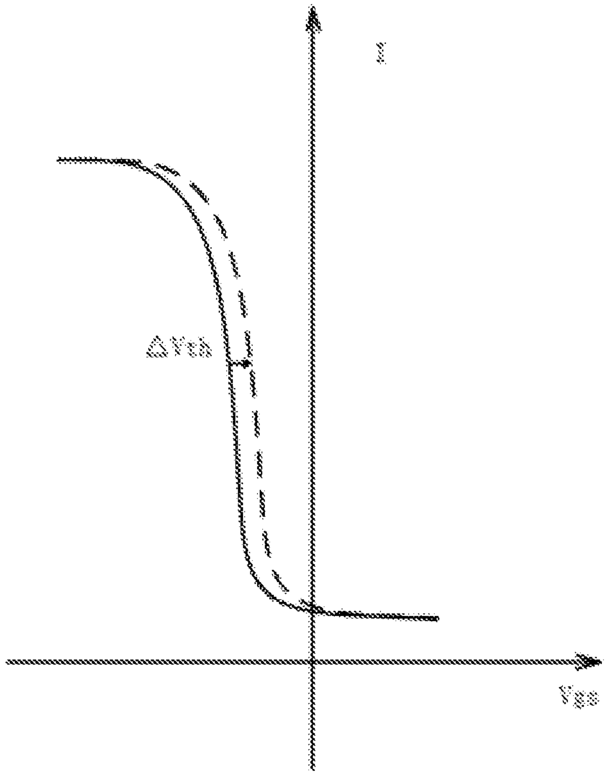
FIG. 4 is a schematic diagram showing characteristic shift in an embodiment of the present disclosure.

In more details, after the write compensation phase P3, a potential at a gate electrode of the drive transistor is Vdata+Vth, where Vdata is a data voltage corresponding to the data signal and Vth is a threshold voltage of the drive transistor. When entering the light-emitting phase P4, the drive transistor is subjected to a stress Vgs1=Vdata+Vth−VDD, where VDD is a power supply voltage received by the drive transistor. The characteristics of the drive transistor included in the driving circuit 11 may shift, i.e., from a solid line to a dashed line, as shown in FIG. 4.

In the bias compensation phase P2, the reset circuit 20 writes a reset voltage V1 to the first terminal or the second terminal of the driving circuit 11. The reset voltage enables the drive transistor to be biased by Vgs2, and Vgs2 satisfies: Vgs2=−Vgs1.

That is: $Vgs2=V\text{data}+V\text{th}-V1=-Vgs1=-(V\text{data}+V\text{th}-VDD)$

It is noted that the voltage Vg of the gate electrode of the driving transistor is kept unchanged when entering the bias compensation phase P2.

$$V1=2*(V\text{data}+V\text{th})-VDD$$

Since VDD is a fixed value, Vth can be measured by testing and therefore the value relationship between V1 and Vdata can be obtained. By setting V1 in accordance with the above relationship, the best compensation effect can be achieved.

In the bias compensation phase P2, since the driving transistor is applied with a bias voltage having the same magnitude and opposite sign as that of the light-emitting phase P4, the characteristic curve can return from the dashed line to the solid line as shown in FIG. 4, thereby realizing the bias compensation.

As shown in FIGS. 2, 3, and 7-9, in some embodiments, the pixel circuit further includes: a second initialization circuit 32.

The second initialization circuit 32 is coupled to the third scanning line S3, a second initialization voltage line Vinit2 and the light-emitting element O1. The second initialization circuit 32 is configured to control a connection between the second initialization voltage line Vinit2 and the light-emitting element O1 under control of the third scanning signal.

Illustratively, the second initialization voltage line Vinit2 is configured to provide a second initialization voltage.

The second initialization circuit 32 is capable of resetting a first electrode of the light-emitting element O1 under control of the third scanning signal.

It is noted that the first electrode of the light-emitting element O1 includes an anode, and a second electrode (i.e., a cathode) of the light-emitting element O1 receives a negative power supply signal VSS.

Figure 7:
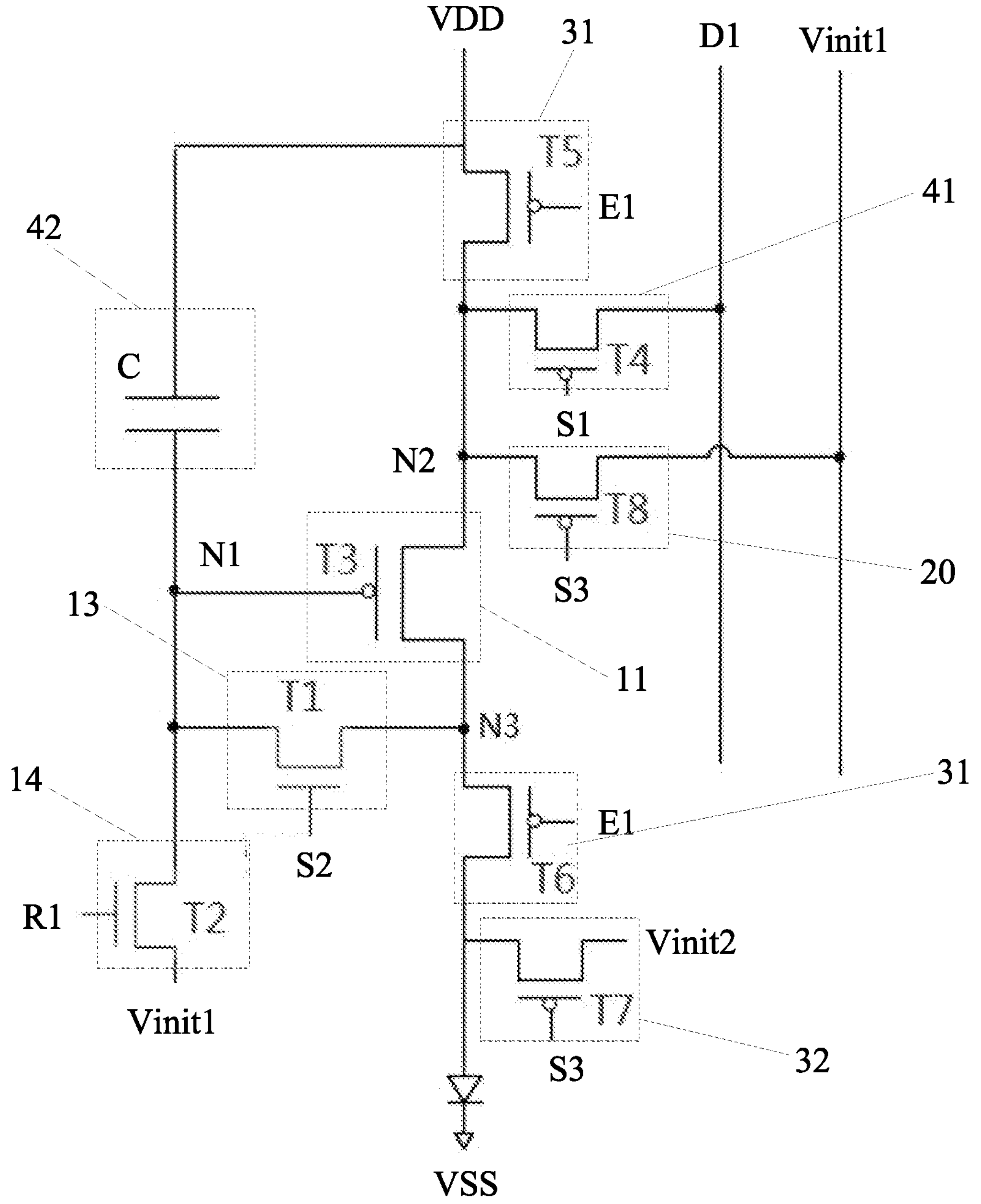
FIG. 7 is a second schematic circuit diagram of a pixel circuit provided in an embodiment of the present disclosure.
Figure 8:
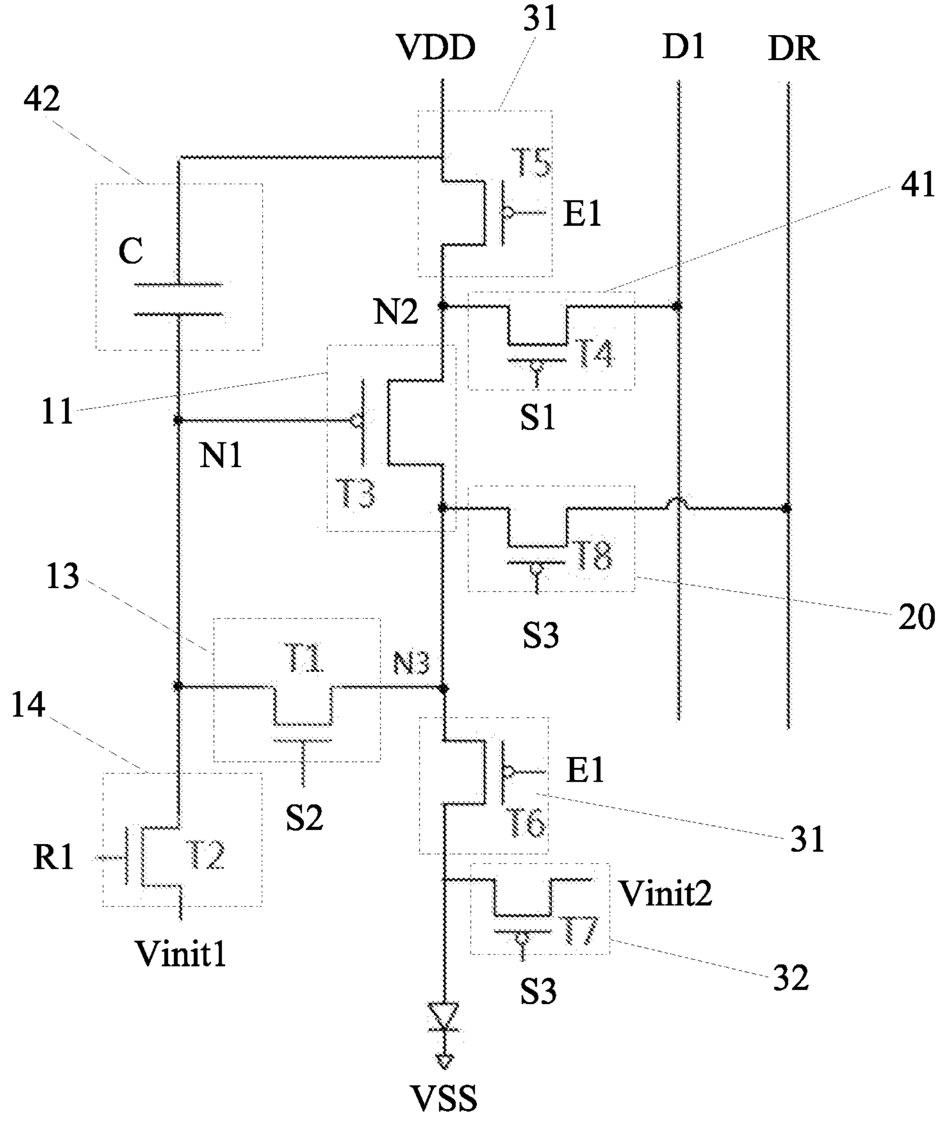
FIG. 8 is a third schematic circuit diagram of a pixel circuit provided in an embodiment of the present disclosure.
Figure 9:
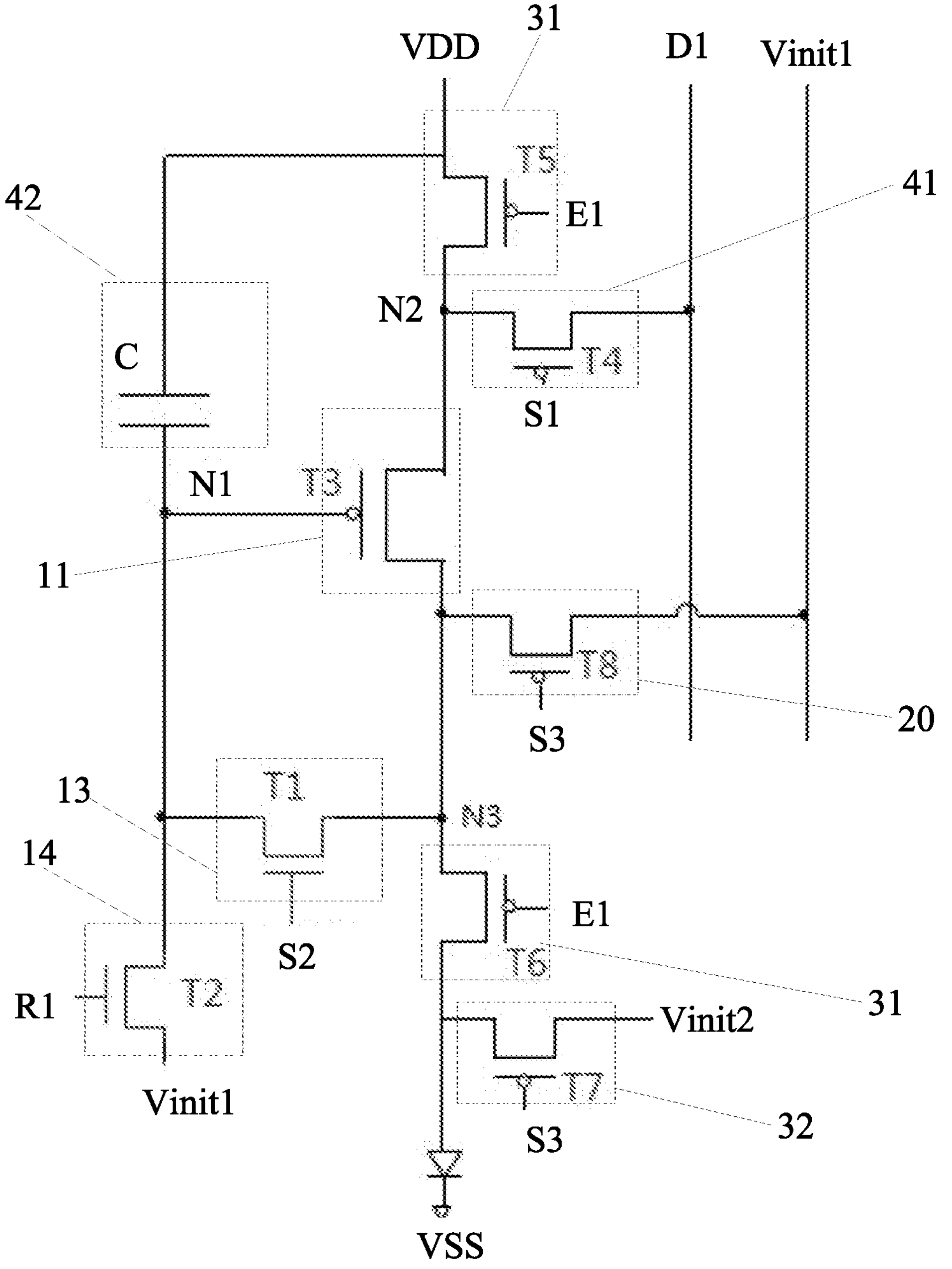
FIG. 9 is a fourth schematic circuit diagram of a pixel circuit provided in an embodiment of the present disclosure.

As shown in FIGS. 7 and 9, in some embodiments, the first initialization voltage line Vinit1 is reused as the reset voltage line DR.

Illustratively, the reset circuit 20 is coupled to the first initialization voltage line Vinit1. A first initialization voltage provided by the first initialization voltage line Vinit1 is adjustable.

Illustratively, the first initialization voltage provided by the first initialization voltage line Vinit1 is variable. Illustratively, the first initialization voltage may be set to −5 V when being used for resetting the gate electrode of the drive transistor, and may be set to 5 V when being used for bias compensation.

By arranging the first initialization voltage line Vinit1 to be reused as the reset voltage line DR, the sub-pixel structure can be simplified, the difficulty in layout design for sub-pixels can be reduced and the resolution of the display substrate can be improved.

As shown in FIGS. 2, 3 and 7-9, in some embodiments, the light-emitting control circuit 31 is further coupled to a first voltage line (for writing VDD signal), the second terminal of the driving circuit 11. The light-emitting control circuit 31 is configured to control a connection between the first voltage line and the second terminal of the driving circuit 11 under control of the light-emitting control signal.

Illustratively, the first voltage line includes a positive power line. Whether the first voltage provided by the first voltage line is written to the second terminal of the driving circuit 11 or not is controlled by the light emission control signal.

As shown in FIGS. 2, 3 and 7-9, in some embodiments, the compensation control circuit 13 includes a first transistor T1, the first initialization circuit 14 includes a second transistor T2, the driving circuit 11 includes a third transistor T3 (namely, the drive transistor), and the light-emitting control circuit 31 includes a fifth transistor T5 and a sixth transistor T6.

A gate electrode of the first transistor T1 is coupled to the second scanning line S2, a first electrode of the first transistor T1 is coupled to a second electrode of the third transistor T3, and a second electrode of the first transistor T1 is coupled to a gate electrode T3-*g* of the third transistor T3.

A gate electrode of the second transistor T2 is coupled to the initialization control line R1, a first electrode of the second transistor T2 is coupled to the first initialization voltage line Vinit1, and a second electrode of the second transistor T2 is coupled to the gate electrode T3-*g* of the third transistor T3.

A gate electrode of the fifth transistor T5 is coupled to the light-emitting control line E1, a first electrode of the fifth transistor T5 is coupled to the first voltage line, and a second electrode of the fifth transistor T5 is coupled to a first electrode of the third transistor T3.

A gate electrode of the sixth transistor T6 is coupled to the light-emitting control line E1, a first electrode of the sixth transistor T6 is coupled to the second electrode of the third transistor T3, and a second electrode of the sixth transistor T6 is coupled to the light-emitting element O1.

In some embodiments, the first transistor T1 and the second transistor T2 are oxide thin-film transistors.

Illustratively, the first transistor T1 and the second transistor T2 include low temperature polycrystalline oxide (Low Temperature Polycrystalline Oxide, LTPO) transistors.

By providing the first transistor T1 and the second transistor T2 to be oxide thin-film transistors, it is advantageous to reduce a current leakage at the gate electrode of the drive transistor, thereby ensuring a stable potential at the gate electrode of the drive transistor.

As shown in FIGS. 2, 3, 7 to 9, in some embodiments, the second initialization circuit 32 includes a seventh transistor T7.

A gate electrode of the seventh transistor T7 is coupled to the third scanning line S3, a first electrode of the seventh transistor T7 is coupled to the second initialization voltage line Vinit2, and a second electrode of the seventh transistor T7 is coupled to the light-emitting element O1.

In some embodiments, the data writing circuit 41 includes a fourth transistor T4, and the reset circuit 20 includes an eighth transistor T8.

A gate electrode of the fourth transistor T4 is coupled to the first scanning line S1, a first electrode of the fourth transistor T4 is coupled to the data line D1, and a second electrode of the fourth transistor T4 is coupled to the first electrode of the third transistor T3.

A gate electrode T8-*g* of the eighth transistor T8 is coupled to the third scanning line S3, a first electrode of the eighth transistor T8 is coupled to the reset voltage line DR, and a second electrode of the eighth transistor T8 is coupled to a first electrode or a second electrode of the third transistor T3.

Illustratively, as shown in FIGS. 2, 3 and 7-9, the reference sign N1 denotes a first node, and the first node N1 is electrically connected to the gate electrode of T3. The reference sign N2 denotes a second node, and the reference sign N3 denotes a third node; N2 is electrically connected to a source electrode of T3 and N3 is electrically connected to a drain electrode of T3.

Illustratively, in at least one embodiment of the pixel circuit, T1 and T2 may be oxide thin-film transistors, each of T3, T4, T5, T6, T7 and T8 may be a low temperature polycrystalline thin-film transistor, T1 and T2 may be n-type transistors, and T3, T4, T5, T6, T7 and T8 may be p-type transistors, but the disclosure is not limited thereto.

Illustratively, T1 and T2 may be single gate transistors or double gate transistors.

Illustratively, for a channel width to length ratio W/L of T1, W ranges from 2 microns to 4 microns, inclusive, and L ranges from 3 microns to 6 microns, inclusive.

Illustratively, T2 has the same channel width to length ratio as T1.

Illustratively, for a channel width to length ratio W/L of T8, W ranges from 2 microns to 3 microns, inclusive, and L ranges from 3.2 microns to 6 microns, inclusive.

As shown in FIGS. 5 and 6, the specific process of driving the pixel circuit having the above-mentioned structure is described as below.

In the initialization phase P1, R1 provides a high voltage signal and T2 is turned on. S1 provides a high voltage signal and T4 is turned off. S2 provides a low voltage signal and T1 is turned off. S3 provides a high voltage signal, T7 and T8 are turned off. In the initialization phase P1, an initialization of the gate electrode of T3 is implemented, so that T3 can be turned on at the beginning of the write compensation phase P3.

In the bias compensation period, R1 provides a low voltage signal and T2 is turned off. S1 provides a high voltage signal and T4 is turned off. S2 provides a low voltage signal and T1 is turned off. S3 provides a low voltage signal and T7 and T8 are turned on. In the bias voltage compensation period, the reset voltage provided by DR can be written to the first electrode or second electrode of the third transistor T3, the second initialization voltage can be written to the anode of O1, and the anode of O1 can be initialized.

In the write compensation phase P3, T3 is turned on. R1 provides a low voltage signal and T2 is turned off. S1 provides a low voltage signal and T4 is turned on. S2 provides a high voltage signal and T1 is turned on. S3 provides a high voltage signal, T7 and T8 are turned off. The data voltage Vdata on the data line D1 is written into the first electrode of the third transistor T3. In the write compensation phase P3, C is charged by Vdata through the turned on T4, T3 and T1, to raise the potential at the gate electrode of T3 until T3 is turned off, at which time the potential of the gate electrode of T3 is Vdata+Vth.

In the light-emitting phase P4, E1 provides a low voltage signal, R1 provides a low voltage signal, S1 provides a high voltage signal, S2 provides a low voltage signal, S3 provides a high voltage signal, T1, T2, T4, T7 and T8 are turned off, T5 and T6 are turned on, and T3 is turned on to drive O1 to emit light.

By arranging T8 to provide a bias voltage for the first electrode or the second electrode of T3, the stability of T3 can be advantageously improved. By arranging T7 to initialize the potential of the anode of O1, the degree of freedom of switch frequency switching at low frequency flicker can be facilitated.

In some embodiments, T3 of the pixel circuit needs to be turned on in a threshold compensation phase. As a result, the voltage difference Vi1−V1 between the first initialization voltage Vi1 provided by the first initialization voltage line Vinit1 and the reset voltage V1 provided by the reset voltage line DR needs to be smaller than the threshold voltage Vth of the drive transistor T3. Vi1 may range from −2V to −6V, for example, Vi1 may be −2V, −3V, −4V, −5V, or −6V and the like. Vi1−V1 can be less than a*Vth, where a may range from 2 to 7, for example, a may be 2, 4, 6, or 7 and the like. Vth may range from −2V to −5V, for example, Vth may be −2V, −3V, or −5V, and the like. V1 may be greater than 1.5 times Vth, for example, V1 can be 1.6 times Vth, 1.8 times Vth, or 2 times Vth, and the like.

Illustratively, V1 is greater than 0. The value of V1 ranges from 4V to 10V, inclusive.

In some embodiments, the width to length ratio W/L of T8 may be approximately equal to the width to length ratio W/L of T7; as another example, the width to length ratio W/L of T8 may be greater than the width to length ratio W/L of T7. In other words, the width to length ratio W/L of T8 may be slightly greater, so that the N2 node can be quickly reset.

In some embodiments, the channel width W of T8 ranges from 1.5 to 3.5, for example, may be 1.6, 1.8, 1.9, 2.0, 2.2, 2.5, or 3.0, and the like; the channel length L of T8 ranges from 2.0 to 4.5, for example, may be 2.5, 2.7, 3.0, 3.2, 3.5, or 4.0, and the like; The channel width W of T7 ranges from 1.5 to 3.5, for example, may be 1.6, 1.8, 1.9, 2.0, 2.2, 2.5, or 3.0, and the like; the channel length L of T7 ranges from 2.0 to 4.5, for example, may be 2.5, 2.7, 3.0, 3.2, 3.5, or 4.0, and the like.

In some embodiments, the width to length ratio W/L of T8 may be approximately equal to the width to length ratio W/L of T2; as another example, the width to length ratio W/L of T8 may be less than the width to length ratio W/L of T2, so that reset capabilities at N1 node and N2 node can be balanced.

In some embodiments, the channel width W of T8 ranges from 1.5 to 3.5, for example, may be 1.6, 1.8, 1.9, 2.0, 2.2, 2.5, or 3.0, and the like; the channel length L of T8 ranges from 2.0 to 4.5, for example, may be 2.5, 2.7, 3.0, 3.2, 3.5, or 4.0, and the like; the channel width W of T2 ranges from 1.5 to 3.5, for example, may be, 1.6, 1.8, 1.9, 2.0, 2.2, 2.5, or 3.0, and the like; the channel length L of T2 ranges from 2.0 to 4.5, for example, may be 2.5, 2.7, 3.0, 3.2, 3.5, or 4.0, and the like.

Figure 1:
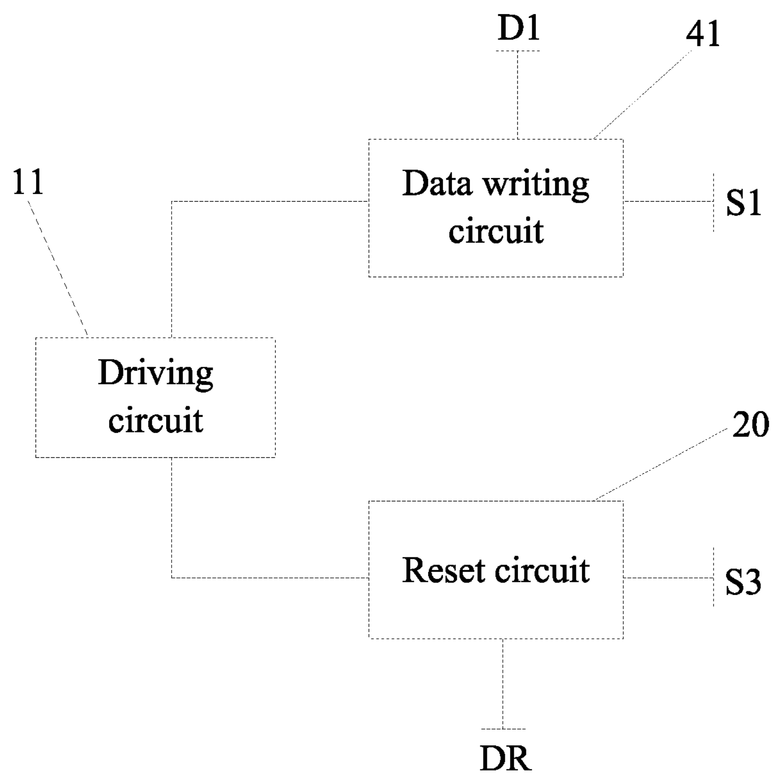
FIG. 1 is a schematic diagram of a first structure of a pixel circuit provided in an embodiment of the present disclosure.
Figure 2:
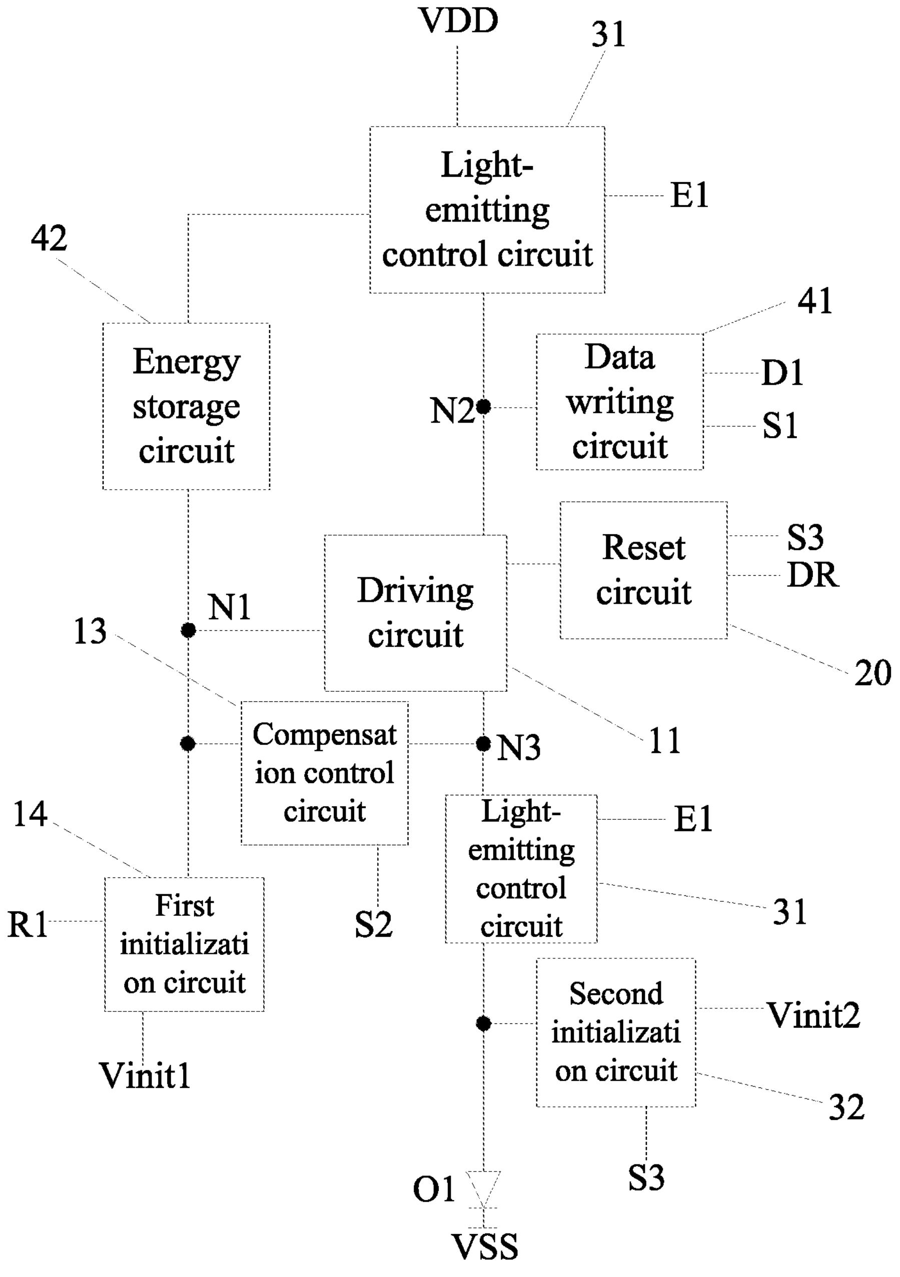
FIG. 2 is a schematic diagram of a second structure of a pixel circuit provided in an embodiment of the present disclosure.
Figure 3:
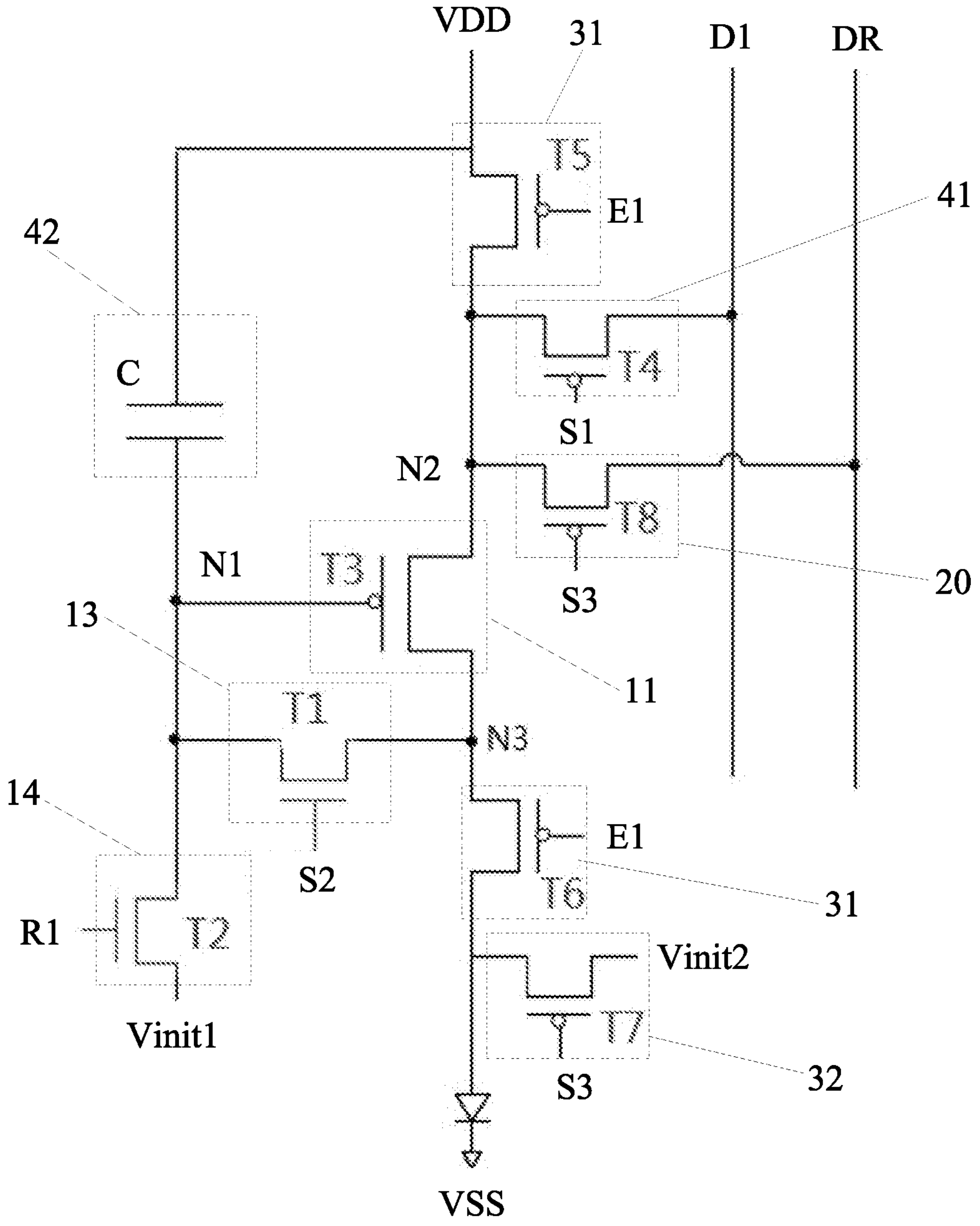
FIG. 3 is a first schematic circuit diagram of a pixel circuit provided in an embodiment of the present disclosure.

As shown in FIGS. 1, 5 and 6, an embodiment of the present disclosure further provides a driving method, applied to the pixel circuit provided by the above-mentioned embodiments, the display period includes a write compensation phase P3 and a bias compensation phase P2, the driving method includes:

in the write compensation phase P3, controlling, by a data writing circuit 41 under control of a first scanning signal, a connection between a data line D1 and a second terminal of a driving circuit 11; and In the bias compensation phase P2, controlling, by a reset circuit 20 under control of a third scanning signal, a connection between the reset voltage line DR and the second terminal of the driving circuit 11 or a connection between the reset voltage line DR and a first terminal of the driving circuit 11.

When the above-mentioned pixel circuit is driven using the driving method provided by the embodiment of the present disclosure, it is possible to apply a bias voltage of opposite sign, as compared with the sign of the bias voltage in the light-emitting phase P4, to the driving circuit 11 in the bias compensation phase P2, thereby compensating for the characteristics shift occurred when the driving circuit 11 has operated at a certain bias voltage for a certain time period, and improving the short-term residual image and the slow response. Moreover, when driving at a low frequency, it is possible to compensate for the difference in luminance caused by the characteristic shift of the driving circuit 11 during a long-time light-emitting phase, thereby improving the Flicker phenomenon. In addition, it is possible to perform specific bias voltage compensation for the driving circuit 11 in each pixel circuit in the display substrate, thereby realizing a good compensation effect. In addition, since the reset voltage provided by the reset voltage line DR can be independently adjusted, an appropriate bias voltage can be provided to each pixel circuit in the display substrate as needed.

As shown in FIGS. 5 and 6, in some embodiments, the display period further includes an initialization phase P1 and a light-emitting phase P4.

In the initialization phase P1, a first initialization circuit 14 in the pixel circuit controls a connection between a first initialization voltage line Vinit1 and a control terminal of the driving circuit 11 under control of an initialization control signal.

In the write compensation phase P3, a compensation control circuit 13 in the pixel circuit controls a connection between the control terminal of the driving circuit 11 and the first terminal of the driving circuit 11 under control of a second scanning signal.

In the light-emitting phase P4, a light-emitting control circuit 31 in the pixel circuit controls a connection between a first voltage line and the second terminal of the driving circuit 11 and a connection between the first terminal of the driving circuit 11 and a light-emitting element O1 under control of a light-emitting control signal, such that the driving circuit 11 drives the light-emitting element O1 to emit light.

In more details, in the initialization phase P1, the first initialization circuit 14 controls the first initialization voltage line Vinit1 to be connected to the control terminal of the driving circuit 11, to initialize the control terminal of the driving circuit 11. In the bias compensation phase P2, the reset circuit 20 controls the reset voltage line DR to be connected to the second terminal of the driving circuit 11, or the reset voltage line DR to be connected to the first terminal of the driving circuit 11. In the write compensation phase P3, the compensation control circuit 13 controls the control terminal of the driving circuit 11 to be connected to the first terminal of the driving circuit 11. In at least some time period of the write compensation phase P3, the data writing circuit 41 the data line D1 to be connected to the second terminal of the driving circuit 11. In the light-emitting phase P4, the light-emitting control circuit 31 controls the first voltage line to be connected to the second terminal of the driving circuit 11, and the first terminal of the driving circuit 11 to be connected to the light-emitting element O1, such that the driving circuit 11 drives the light-emitting element O1 to emit light.

As shown in FIGS. 5 and 6, in some embodiments, the display period further includes a plurality of light-emitting phases P4 and a plurality of bias compensation phases P2, the light-emitting phases P4 and the bias compensation phases P2 being alternately arranged.

Illustratively, the display period include the following phases in the sequence listed: an initialization phase P1, a bias compensation phase P2, a write compensation phase P3, a light-emitting phase P4, a bias compensation phase P2, a light-emitting phase P4, a bias compensation phase P2, a light-emitting phase P4, a bias compensation phase P2, and a light-emitting phase P4.

Note that the quantity of the light-emitting phases P4 and the quantity of the bias compensation phases P2 may be set according to actual needs.

By implementing bias compensation in several fixed phases within one frame, it is advantageous for implementing bias compensation for the driving circuit 11 when the display substrate is in a low-frequency display.

In some embodiments, the line scan time h is taken as one unit, 1 h=1 second/(refresh frequency*total quantity of lines).

The width of the period in which the light-emitting control signal provided by the light-emitting control line E1 is at the active level (such as high level) ranges from 30 h to 40 h, inclusive.

The width of the period in which the initialization control signal provided by the initialization control line R1 is at the active level (such as high level) ranges from 10 h to 15 h, inclusive.

The width of the period in which the second scanning signal provided by the second scanning line S2 is at the active level (such as high level) ranges from 10 h to 15 h, inclusive.

The width of the period in which the third scanning signal provided by the third scanning line S3 is at the active level (such as low level) ranges from 1 h to 3 h, inclusive.

The width of the period in which the first scanning signal provided by the first scanning line S1 is at the active level (such as low level) ranges from 1 h to 3 h, inclusive.

The width of the period in which the data signal provided by the data line D1 is at the active level includes 1 h.

Illustratively, the width of the period in which the light emission control signal is at the active level is 2 to 4 times the width of the period in which the initialization control signal is at the active level.

Illustratively, the width of the period in which the light emission control signal is at the active level is 2 to 4 times the width of the period in which the second scanning signal is at the active level.

As shown in FIGS. 1-9, 11, 23, and 30, embodiments of the present disclosure also provide a display substrate, including a base substrate and a plurality of sub-pixels disposed on the base substrate, the sub-pixel includes the pixel circuit provided in the above embodiments; the sub-pixel further includes:

a data line D1, a reset voltage line DR, a first scanning line S1 and a third scanning line S3; the data line D1 includes at least a portion extending in a first direction, the first scanning line S1 includes at least a portion extending in a second direction, the third scanning line S3 includes at least a portion extending in the second direction, and the second direction intersects with the first direction.

A data writing circuit 41 is coupled to the first scanning line S1, the data line D1 and a second terminal of a driving circuit 11. The data writing circuit 41 is configured to control a connection between the data line D1 and the second terminal of the driving circuit 11 under control of a first scanning signal provided by the first scanning line S1.

The reset circuit 20 is coupled to the third scanning line S3 and the reset voltage line DR, and is also coupled to a first terminal or the second terminal of the driving circuit 11. The reset circuit 20 is configured for, under control of a third scanning signal provided by the third scanning line S3, controlling a connection between the reset voltage line DR and the second terminal of the driving circuit 11; or controlling a connection between the reset voltage line DR and the first terminal of the driving circuit 11.

Illustratively, the display substrate includes a plurality of sub-pixels arranged in an array, each sub-pixel includes a pixel circuit.

Illustratively, in sub-pixels located in the same column along the first direction, data lines D1 are successively coupled to form a one-piece structure.

Illustratively, in sub-pixels located in the same column along the first direction, reset voltage lines DR are successively coupled to form a one-piece structure. Illustratively, in sub-pixels located in the same row in the second direction, reset voltage lines DR are successively coupled to form a one-piece structure.

Illustratively, in sub-pixels located in the same row along the second direction, first scanning lines S1 are successively coupled to form a one-piece structure. Illustratively, in sub-pixels located in the same row along the second direction, third scanning lines S3 are successively coupled to form a one-piece structure.

Illustratively, the display substrate includes the following elements arranged in a stack on the base substrate in a direction away from the base substrate: a light shielding layer, an isolation layer, a first buffer layer, a poly active layer, a first gate insulating layer, a first gate metal layer, a second gate insulating layer, a second gate metal layer, a first interlayer insulating layer, a second buffer layer, an oxide active layer (such as IGZO), a third gate insulating layer, a third gate metal layer, a second interlayer insulating layer, a first source-drain metal layer, a passivation layer, a first planarization layer, a second source-drain metal layer, a second planarization layer, an anode layer, a pixel definition layer, a spacer layer, a light-emitting functional layer, a cathode layer and an encapsulation layer.

Illustratively, the base substrate includes a PI base. After forming the second interlayer insulating layer by deposition, a CNT perforating process may be performed (e.g., CNT-L/EBA and CNT-O/EBB), and then continuing the mask process of the interlayer insulating layer to form a via hole penetrating the second interlayer insulating layer only, a via hole penetrating the second interlayer insulating layer to the third gate insulating layer, a via hole penetrating the second interlayer insulating layer to the first interlayer insulating layer, a via hole penetrating the second interlayer insulating layer to the second gate insulating layer, a via hole penetrating the second interlayer insulating layer to the first gate insulating layer, and a via hole penetrating the second interlayer insulating layer to the isolation layer.

Illustratively, the data line D1 is made by using the second source-drain metal layer. The reset voltage line DR is made by using the second source-drain metal layer or the first source-drain metal layer. The first scanning line S1 and the third scanning line S3 are both made by using the first gate metal layer.

Illustratively, the first direction includes a longitudinal direction and the second direction includes a transverse direction.

Since in the pixel circuit provided by the above-mentioned embodiments, by providing the reset circuit 20, it is possible to apply a bias voltage having an opposite sign to that of the light-emitting phase P4 to the driving circuit 11 in the bias compensation phase P2, the characteristics shift of the driving circuit when being operated at a certain bias voltage for a certain time period can be compensated for, and the short-term residual image and the slow response can be improved. Moreover, when driving at a low frequency, it is possible to compensate for the difference in luminance caused by the characteristic shift of the driving circuit 11 during a long-time light-emitting phase, thereby improving the Flicker phenomenon. Therefore, in a case that the display substrate provided by the embodiments of the present disclosure includes the above-mentioned pixel circuit, the above-mentioned advantageous effects can also be achieved, and the description thereof will not be repeated here.

In addition, when the display substrate provided in the embodiments of the present disclosure includes the above-mentioned pixel circuit, it is possible to perform a bias compensation specific to the driving circuit 11 in each pixel circuit in the display substrate, thereby realizing a good compensation effect. Furthermore, since the reset voltage provided by the reset voltage line DR can be independently adjusted, an appropriate bias voltage can be provided to each pixel circuit in the display substrate as needed.

In some embodiments, the display substrate includes a plurality of pixel circuits P distributed in an array, and a plurality of reset voltage lines DR11, DR12, DR21, DR22, the reset voltage lines DR11, DR12, DR21, DR22 may each be configured for providing a reset voltage.

Figure 10:
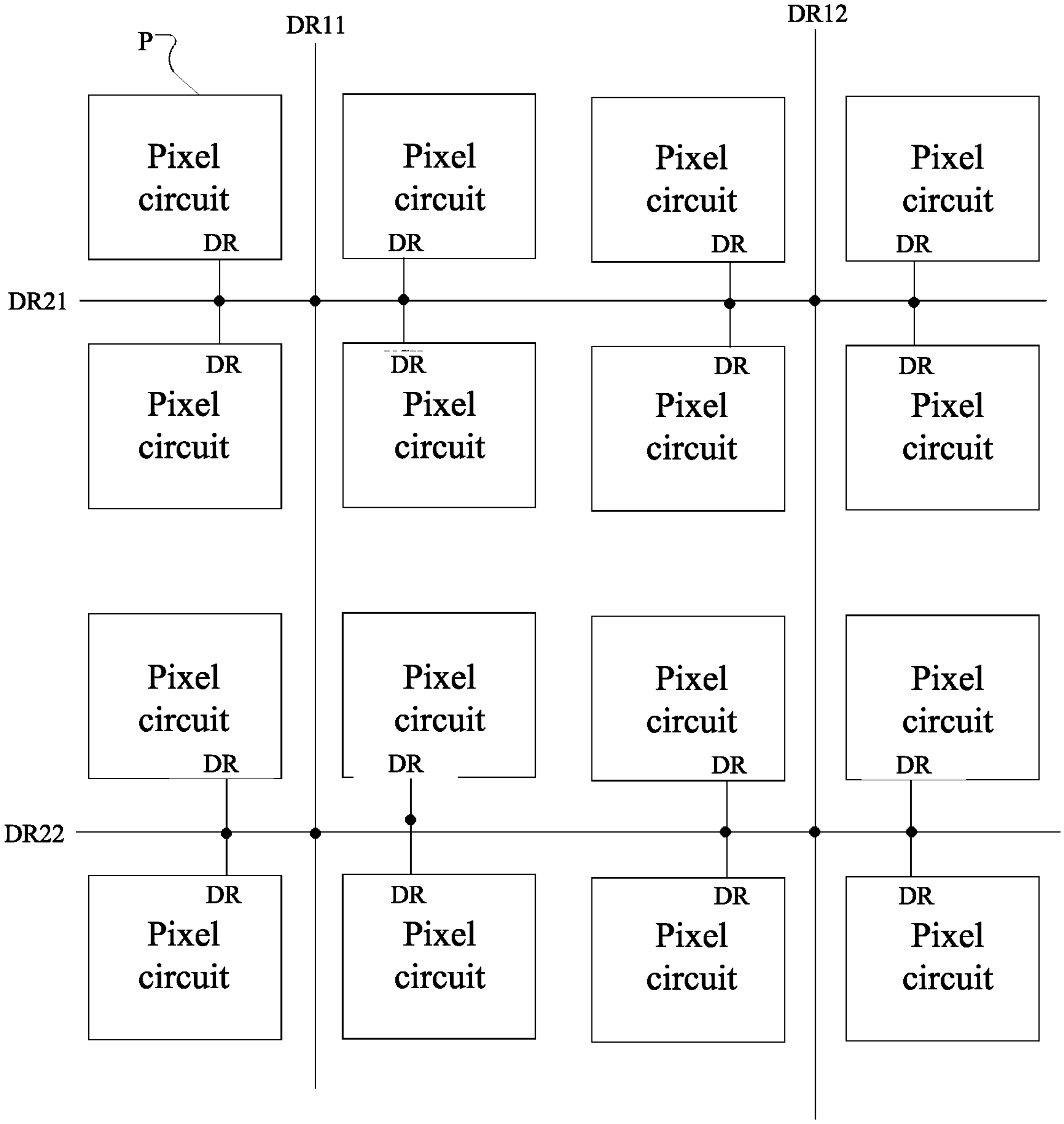
FIG. 10 is a schematic layout diagram of a display substrate provided in an embodiment of the present disclosure.

As shown in FIG. 10, reset voltage lines DR11 and DR12 extend in the column direction, reset voltage lines DR21 and DR22 extend in the row direction, two adjacent rows of pixel circuits may be connected to the same one reset voltage line DR extending in the row direction, which reset voltage line DR may be located between the two adjacent rows of pixel driving circuits 11. The reset voltage line DR extending in the column direction may be connected to a plurality of reset voltage lines DR extending in the row direction with which it, so that the plurality of reset voltage lines DR may form a grid structure. Here, the reset voltage line DR extending in the column direction may be located in a region where a red pixel circuit is located. In addition, in the same pixel row, two pixel circuits in adjacent columns may be mirrored to facilitate wiring.

As shown in FIGS. 11 to 22, in some embodiments, the driving circuit 11 includes a third transistor T3 and the reset circuit 20 includes an eighth transistor T8.

A gate electrode T8-*g* of the eighth transistor T8 is coupled to the third scanning line S3, a first electrode of the eighth transistor T8 is coupled to the reset voltage line DR, and a second electrode of the eighth transistor T8 is coupled to a first electrode of the third transistor T3.

The reset voltage line DR includes at least a portion extending in the first direction, and the reset voltage line DR and the data line D1 are arranged along the second direction. An orthographic projection of the reset voltage line DR onto the base substrate at least partially overlaps with an orthographic projection of the gate electrode of the drive transistor onto the base substrate.

Illustratively, the gate electrode T3-*g* of the third transistor T3 is made by using the first gate metal layer. The gate electrode T8-*g* of the eighth transistor T8 and the third scanning line S3 are formed as a one-piece structure.

Illustratively, the reset voltage line DR and the data line D1 are disposed in the same layer and made of the same material.

Illustratively, an orthographic projection of the data line D1 onto the base substrate does not overlap with the orthographic projection of the gate electrode of the drive transistor onto the base substrate. The orthographic projection of the reset voltage line DR onto the base substrate at least partially overlaps with the orthographic projection of the gate electrode of the drive transistor onto the base substrate.

Figure 34:
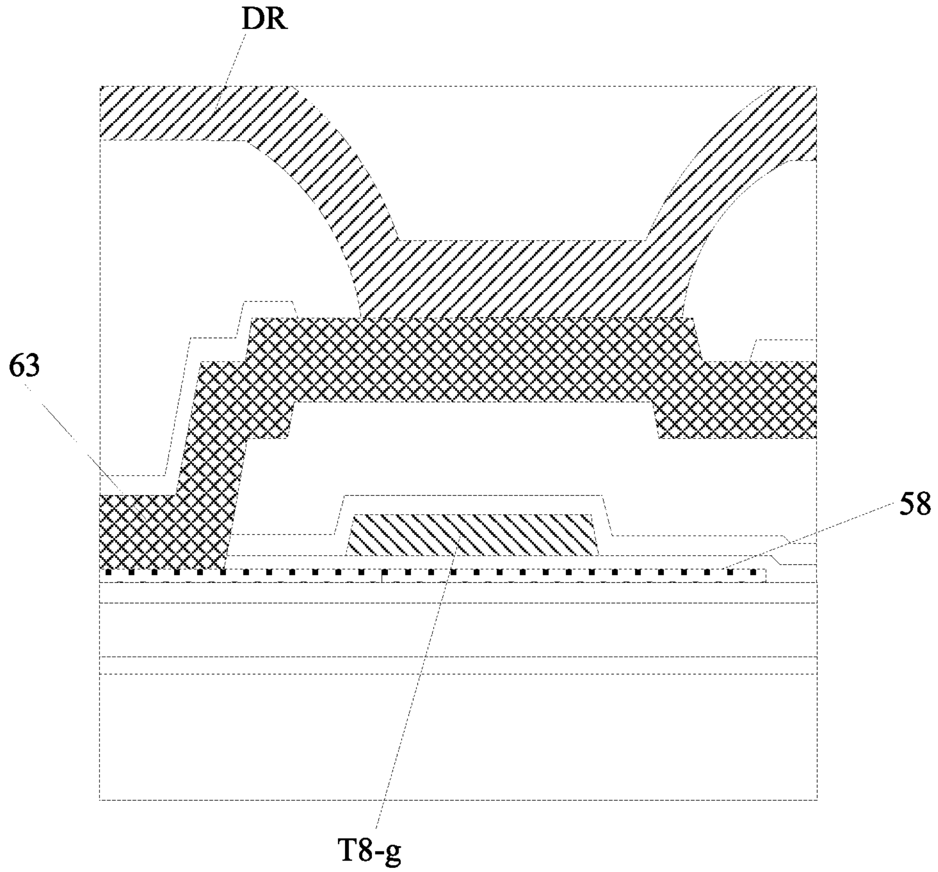
FIG. 34 is a schematic cross-sectional view of an eighth transistor provided in an embodiment of the present disclosure.

As shown in FIG. 34, illustratively, the eighth transistor T8 is coupled to the reset voltage line DR by a third conductive connection portion 63.

Figure 12:
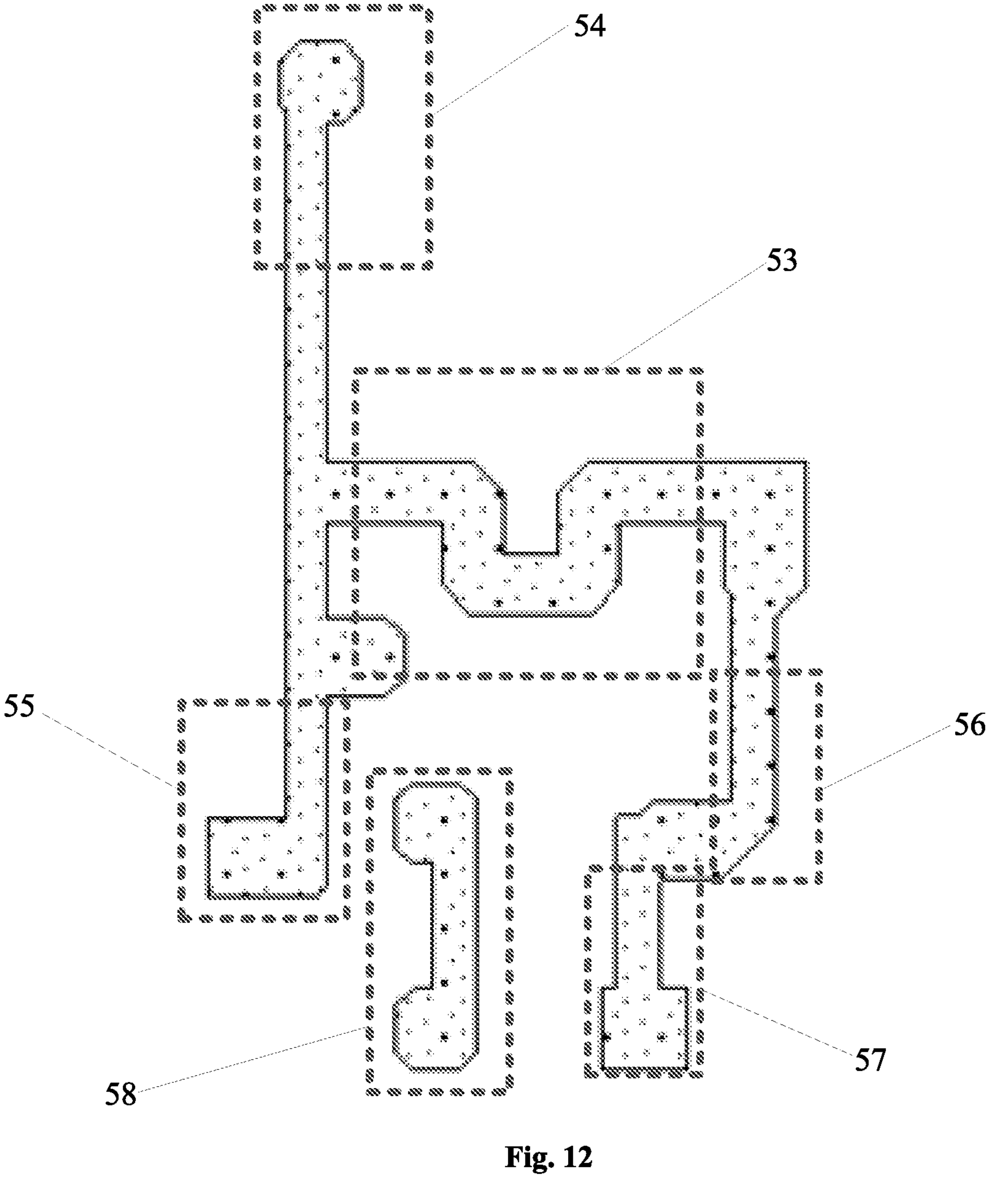
FIG. 12 is a schematic layout diagram of a poly active layer in FIG. 11.
Figure 13:
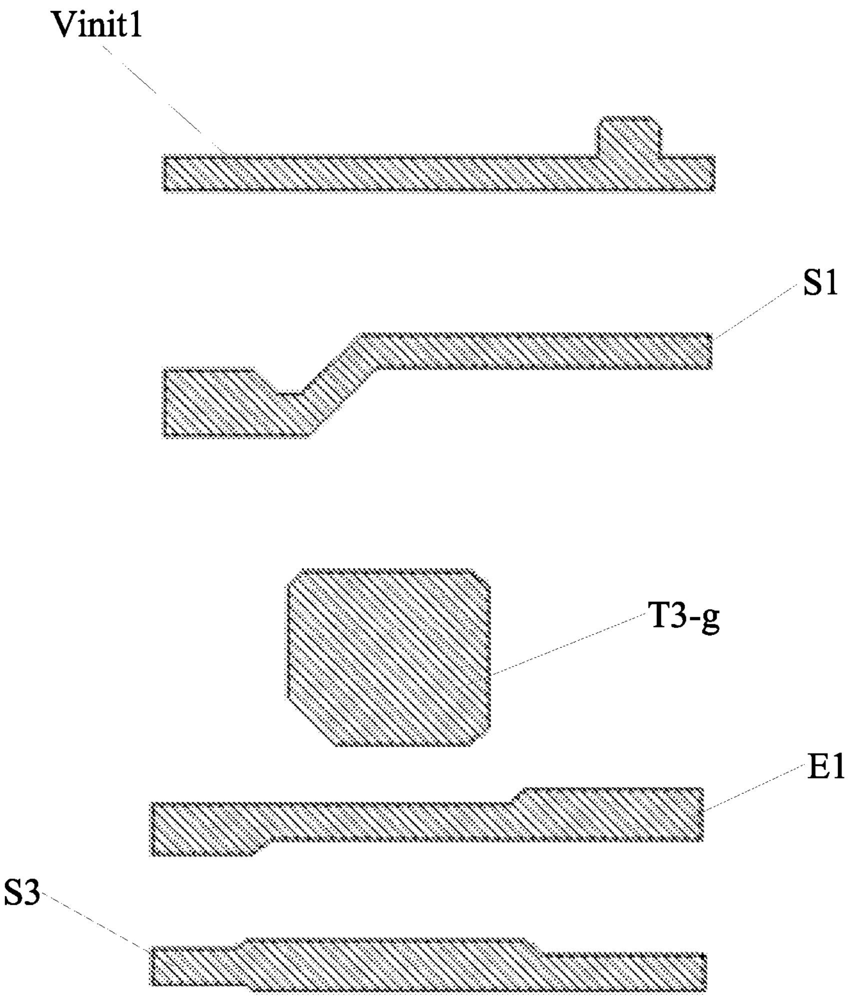
FIG. 13 is a schematic layout diagram of a first gate metal layer in FIG. 11.
Figure 15:
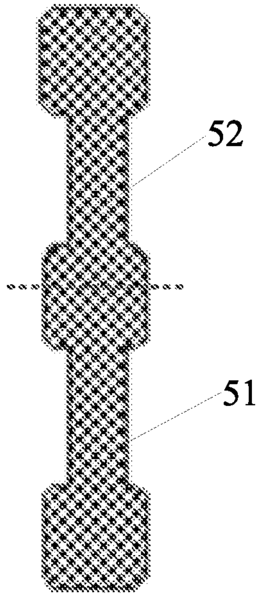
FIG. 15 is a schematic layout diagram of a oxide active layer in FIG. 11.
Figure 19:
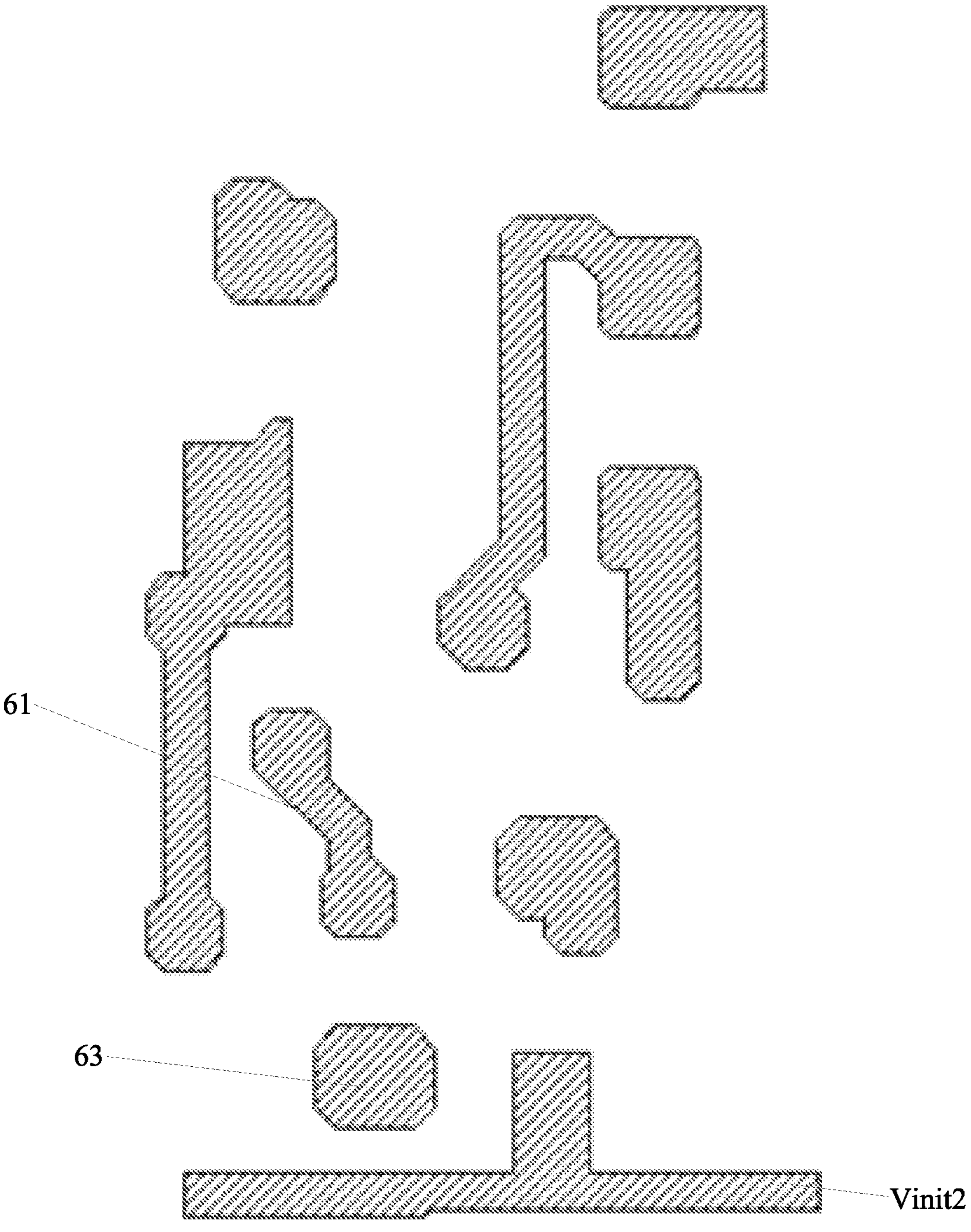
FIG. 19 is a layout diagram of a first source-drain metal layer in FIG. 11.
Figure 20:
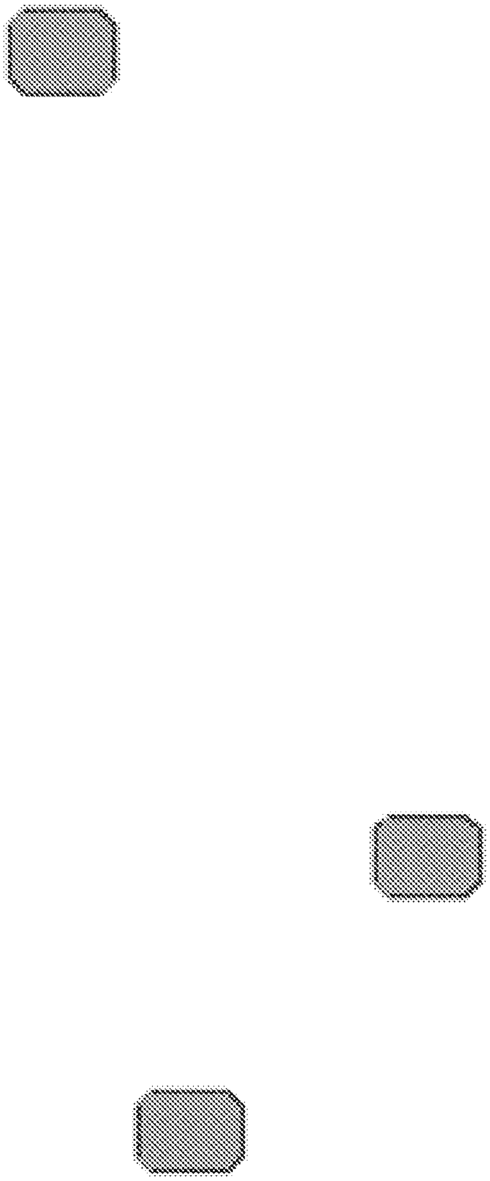
FIG. 20 is a schematic diagram of a via hole formed by a passivation layer in FIG. 11.
Figure 21:
FIG. 21 is a schematic diagram of a via hole formed by a first planarization layer in FIG. 11.
Figure 22:
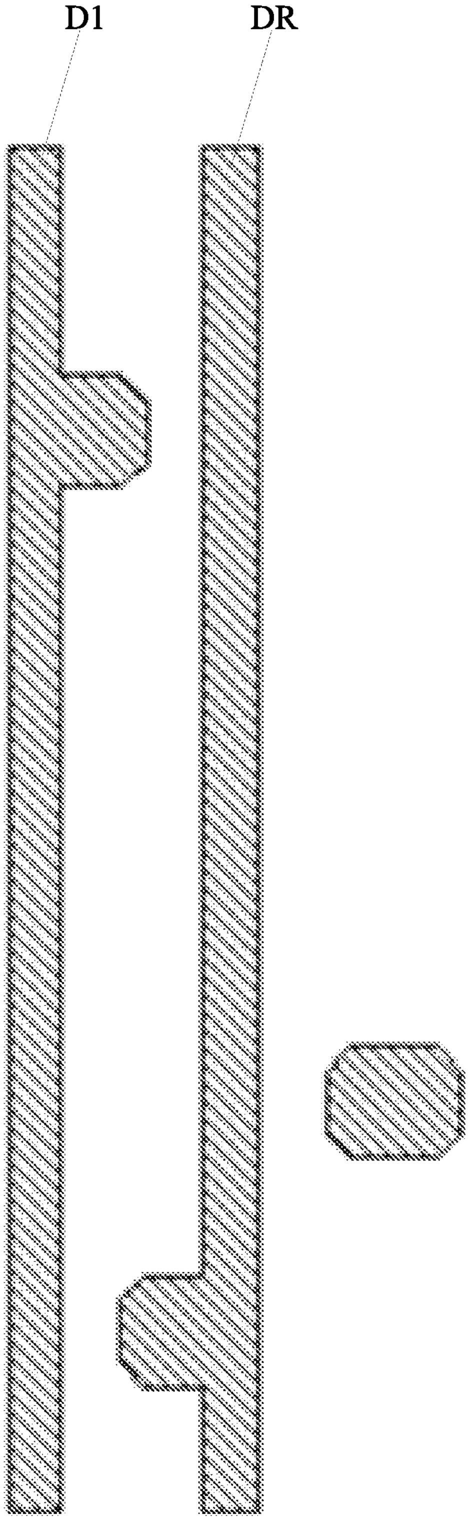
FIG. 22 is a schematic layout diagram of a second source-drain metal layer in FIG. 11.
Figure 33:
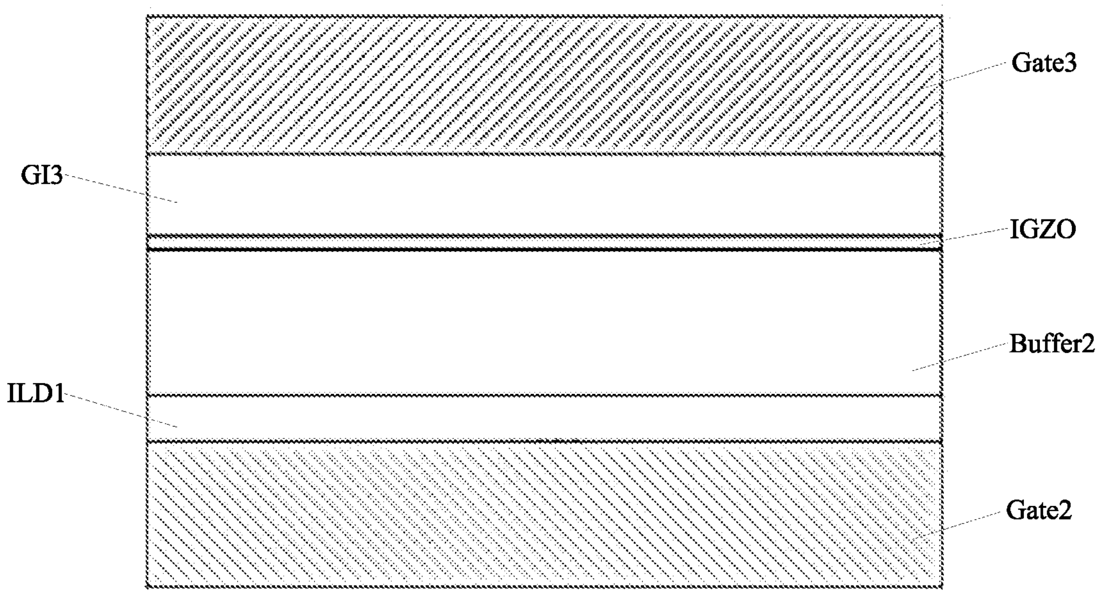
FIG. 33 is a schematic diagram of a stack of a second gate metal layer to a third gate metal layer provided in an embodiment of the present disclosure.

It is noted that FIG. 12 illustrates a third active layer 53 included in T3, a fourth active layer 54 included in T4, a fifth active layer 55 included in T5, a sixth active layer 56 included in T6, and a seventh active layer 57 included in T7. FIG. 15 illustrates a first active layer 51 included in T1 and a second active layer 52 included in T2. FIG. 19 illustrates the third conductive connection portion 63. FIG. 33 illustrates a second gate metal layer Gate2, a first interlayer insulating layer ILD1, a second buffer layer Buffer2, an oxide layer (IGZO), a third gate insulating layer GI3, and a third gate metal layer Gate3.

Figure 17:
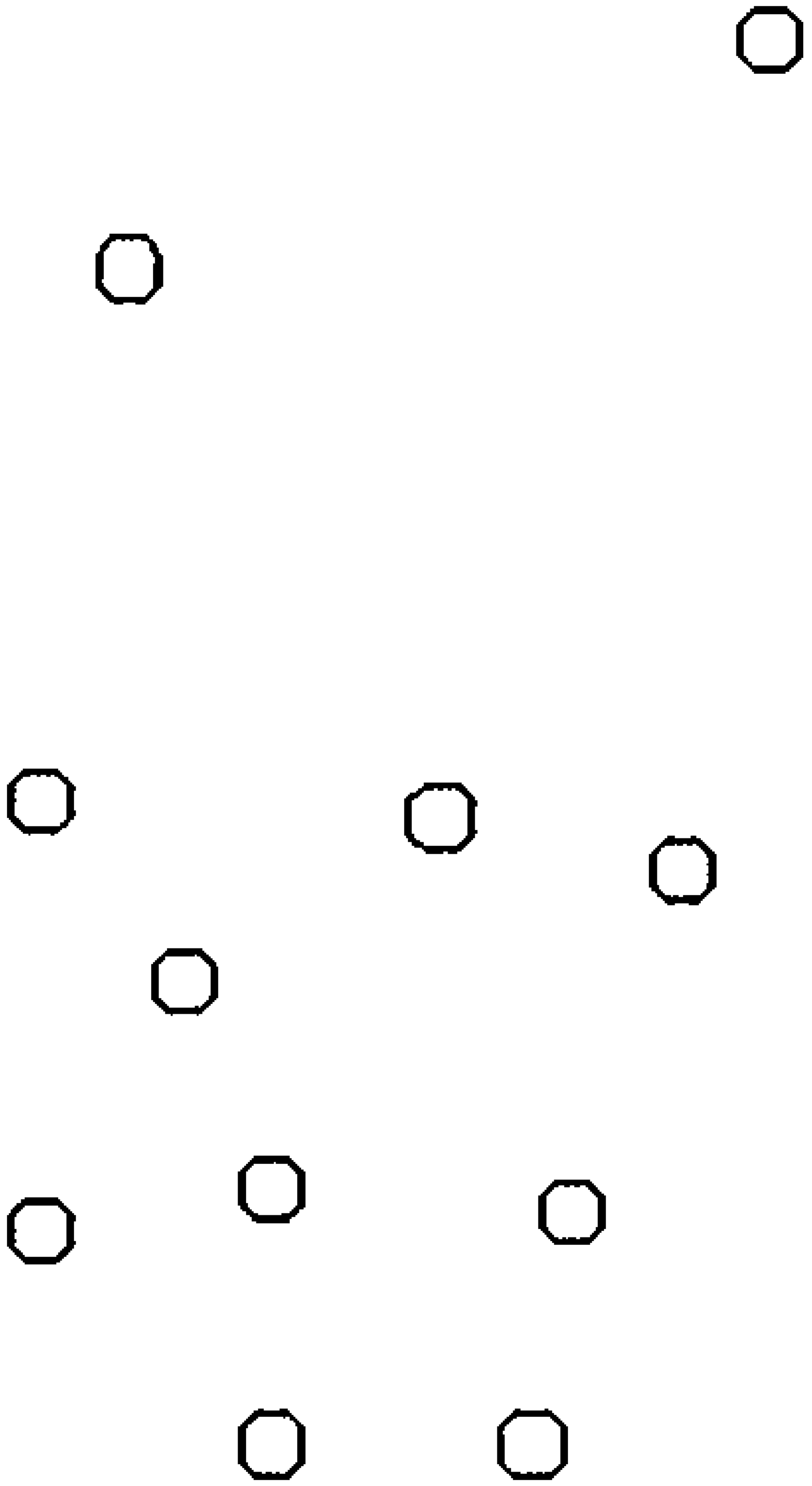
FIG. 17 is a schematic diagram of a first connecting hole in FIG. 11.
Figure 18:
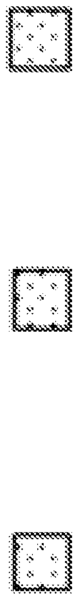
FIG. 18 is a schematic diagram of a second connecting hole in FIG. 11.

It is noted that the first connecting hole in FIG. 17 is used for connecting the first source-drain metal layer and corresponding structure under the first source-drain metal layer, and the depths of first connecting holes in FIG. 17 may be the same or different. The second connecting hole in FIG. 18 is used for connecting the first source-drain metal layer and corresponding structure under the first source-drain metal layer, and the depths of second connecting holes in FIG. 18 may be the same or different.

Figure 11:
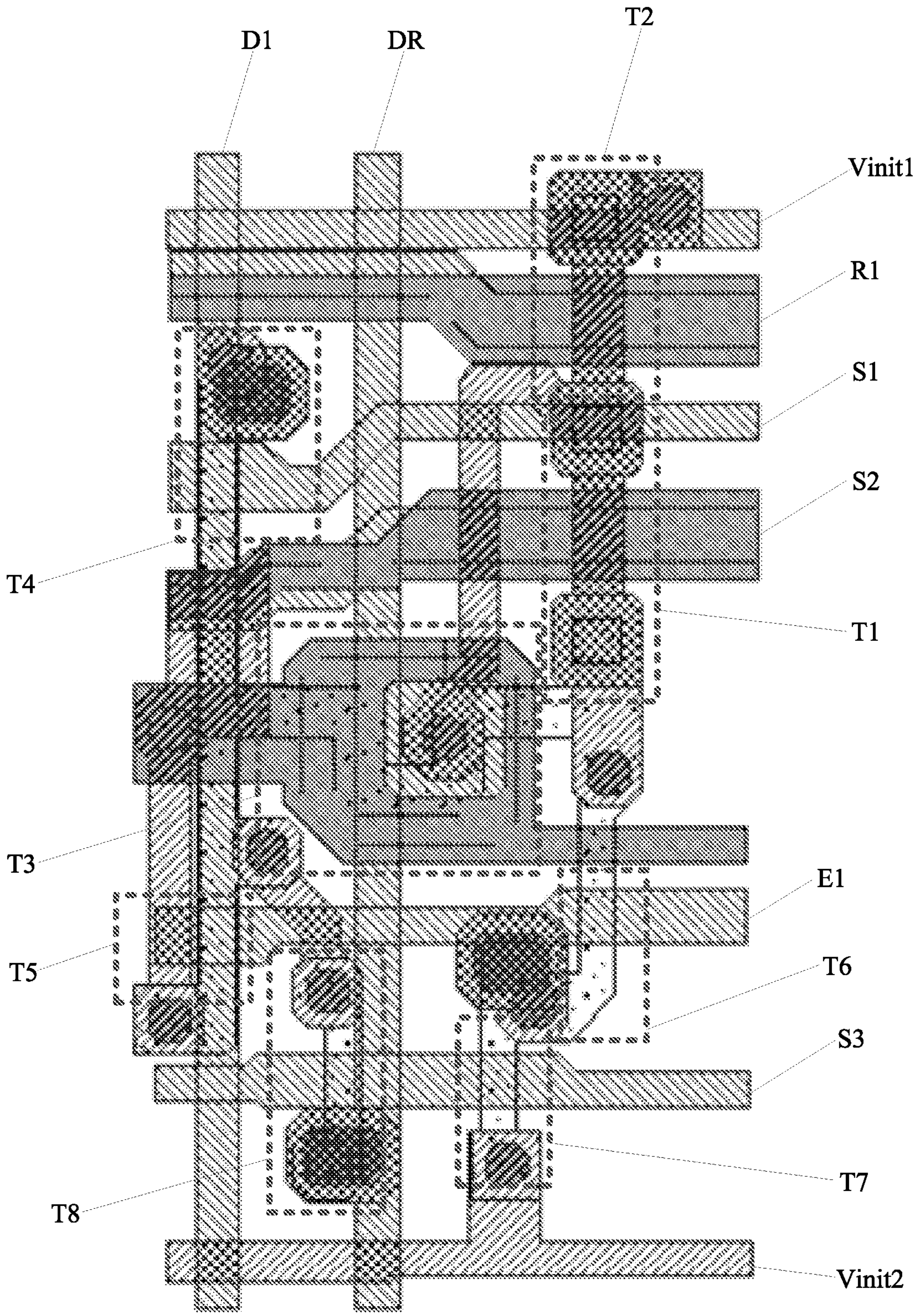
FIG. 11 is a schematic layout diagram corresponding to FIG. 3.
Figure 23:
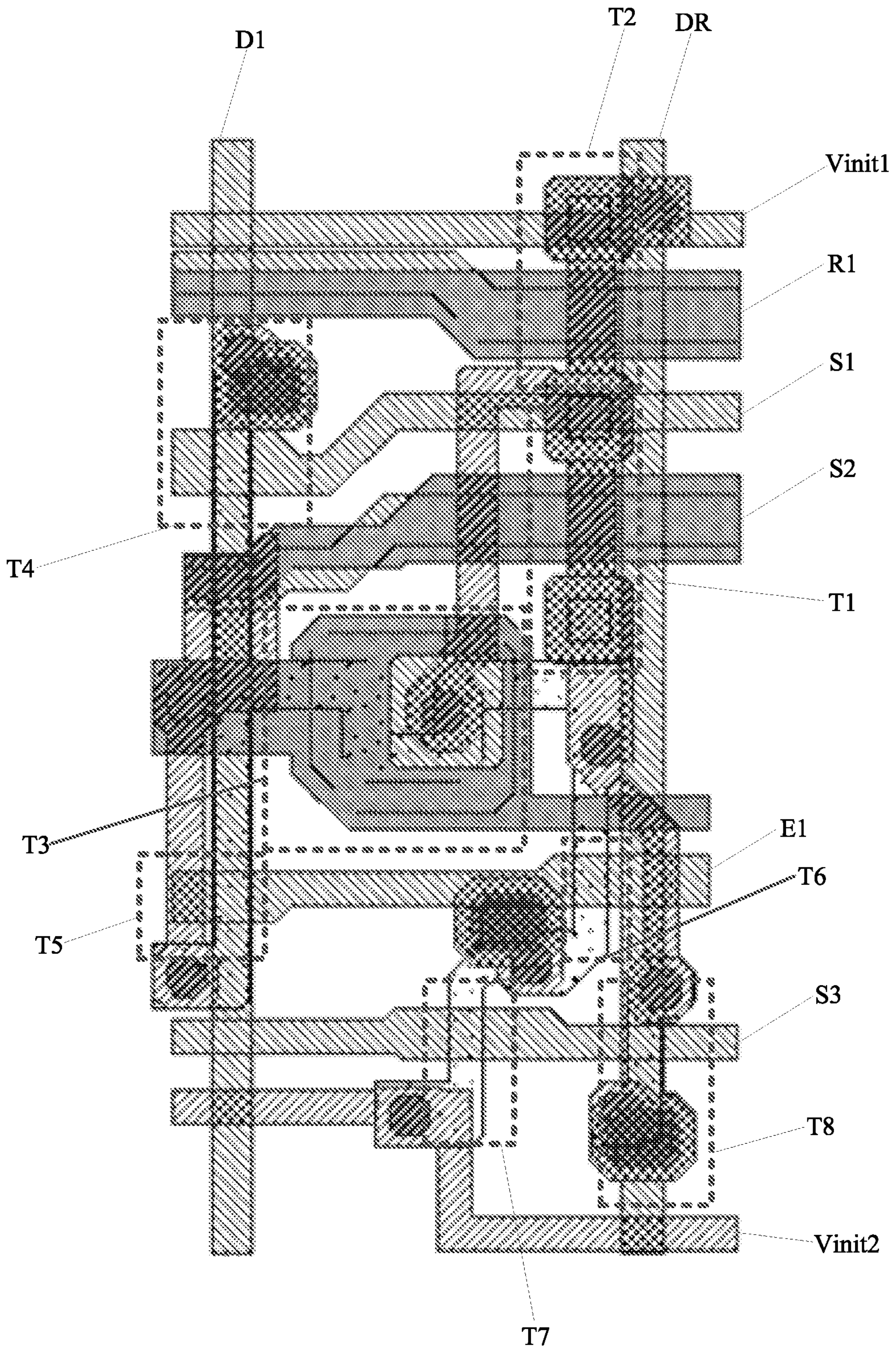
FIG. 23 is a schematic layout diagram corresponding to FIG. 8.
Figure 24:
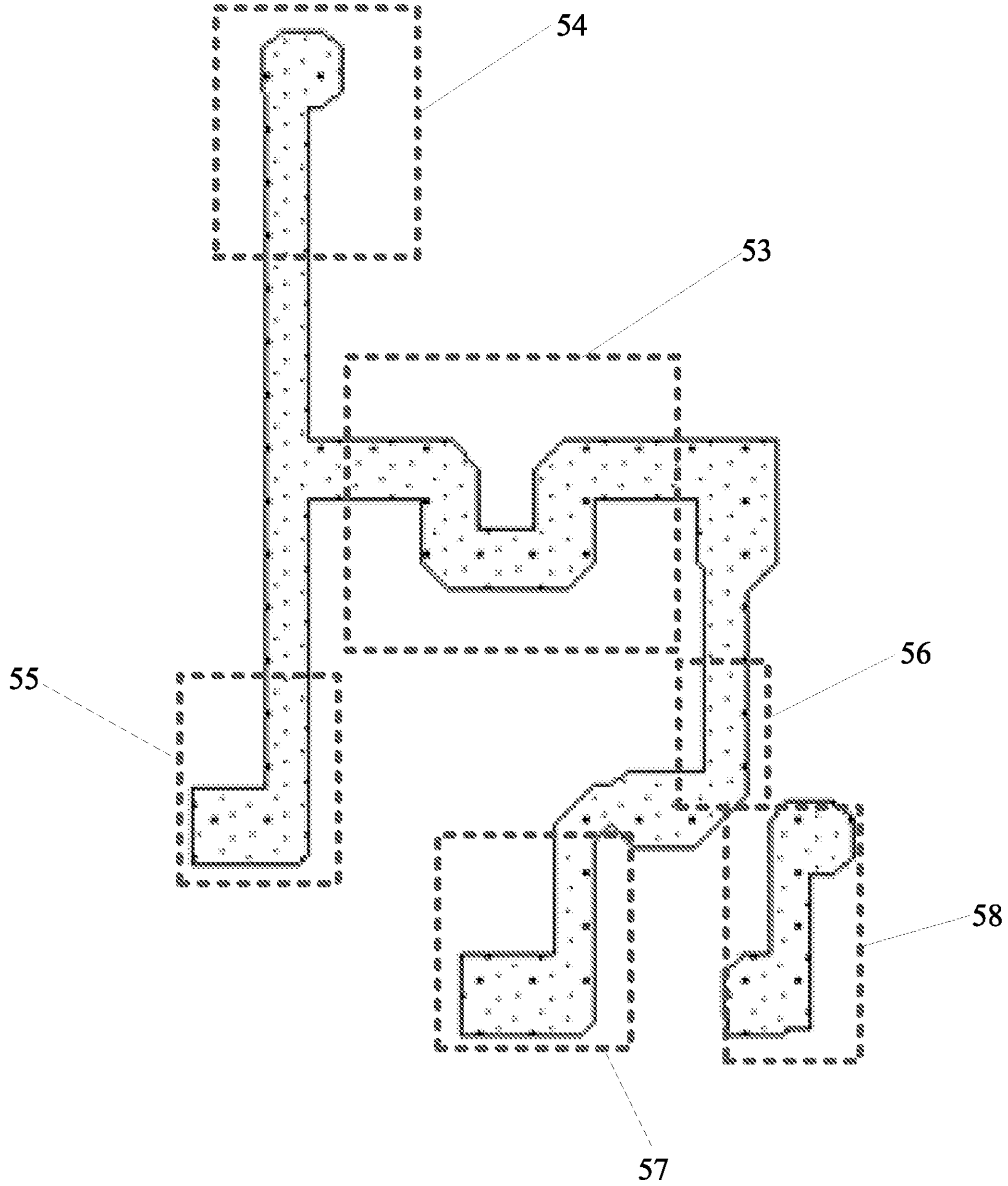
FIG. 24 is a schematic layout diagram of a poly active layer in FIG. 23.
Figure 25:
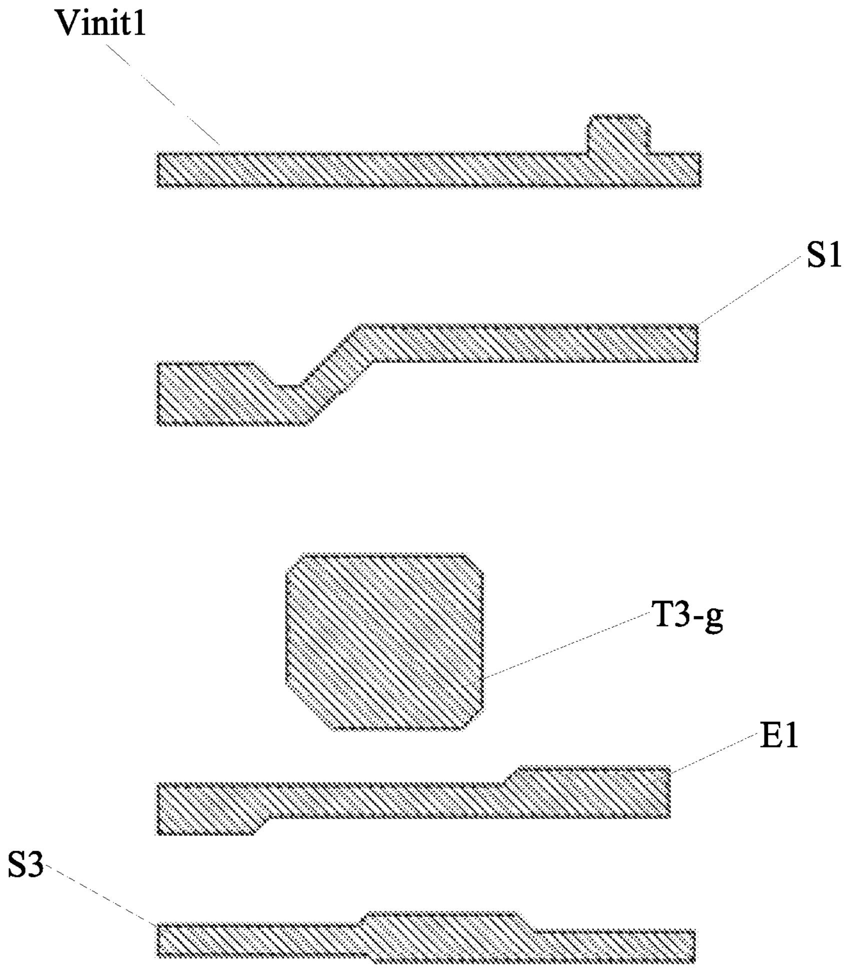
FIG. 25 is a schematic layout diagram of a first gate metal layer in FIG. 23.
Figure 26:
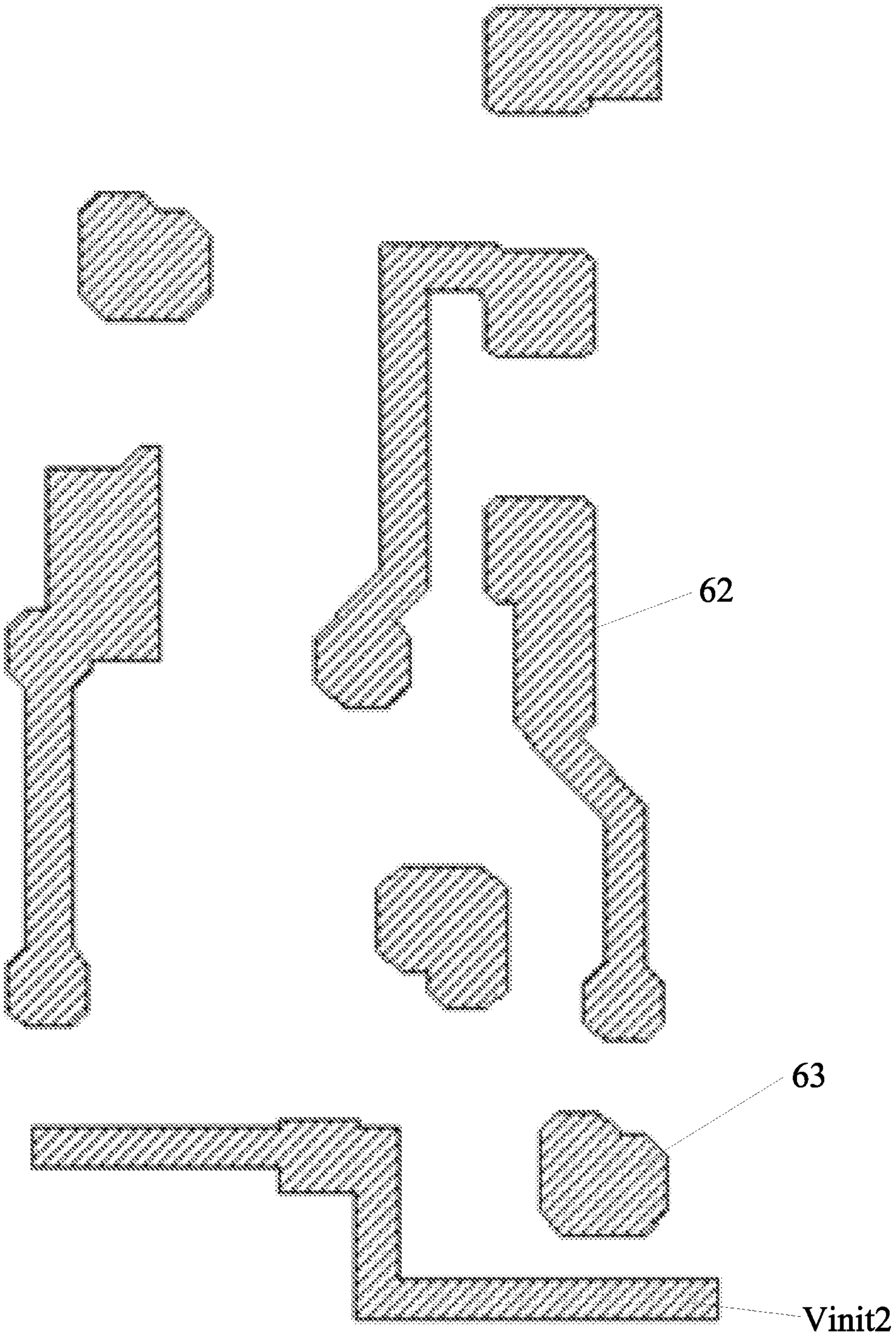
FIG. 26 is a schematic layout diagram of a first source-drain metal layer in FIG. 23.
Figure 27:
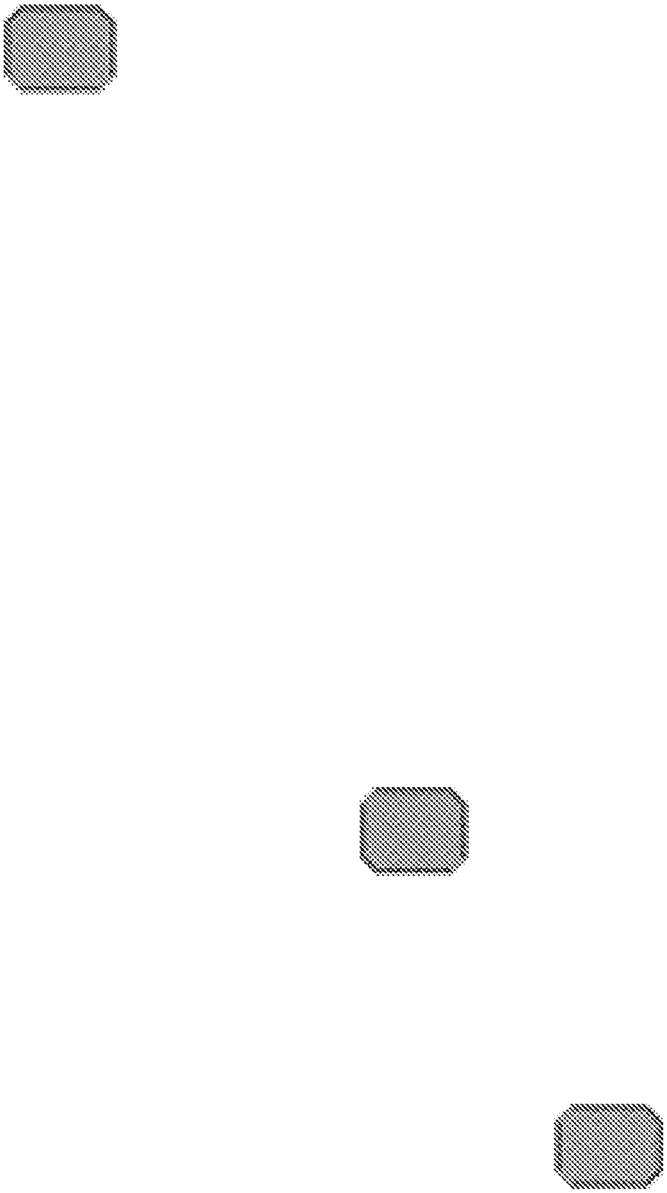
FIG. 27 is a schematic diagram of a via hole formed by a passivation layer in FIG. 23.
Figure 28:
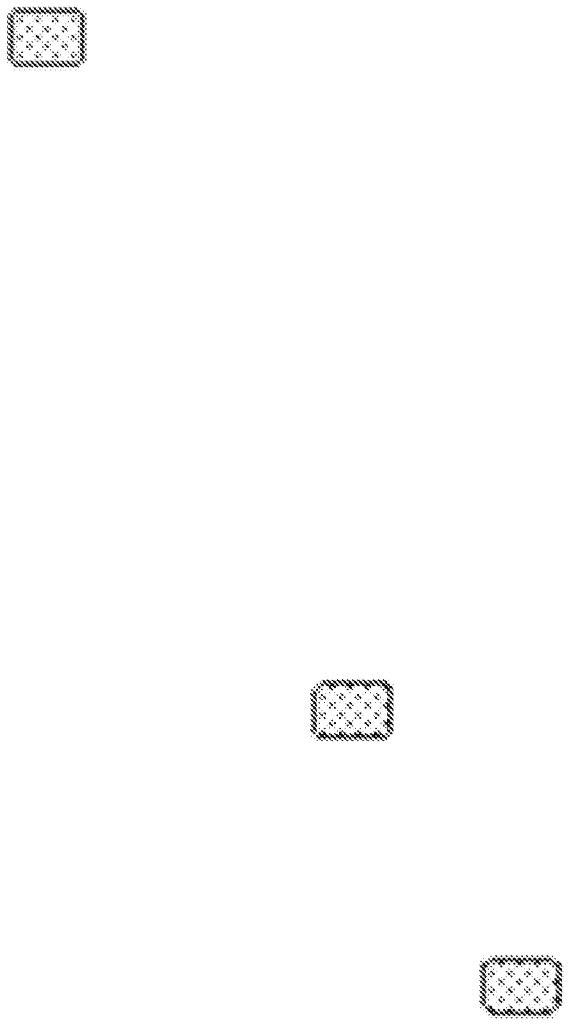
FIG. 28 is a schematic diagram of a via hole formed by a first planarization layer in FIG. 23.
Figure 29:
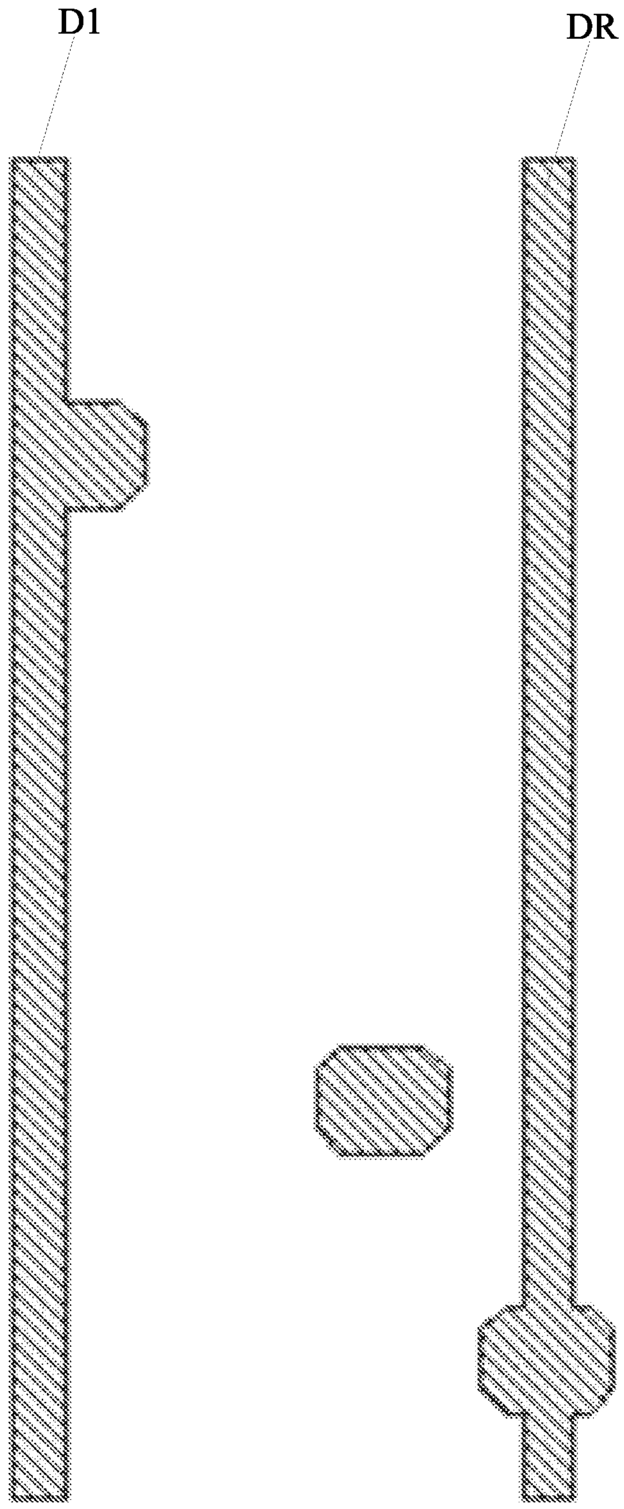
FIG. 29 is a schematic layout diagram of a second source-drain metal layer in FIG. 23.
Figure 30:
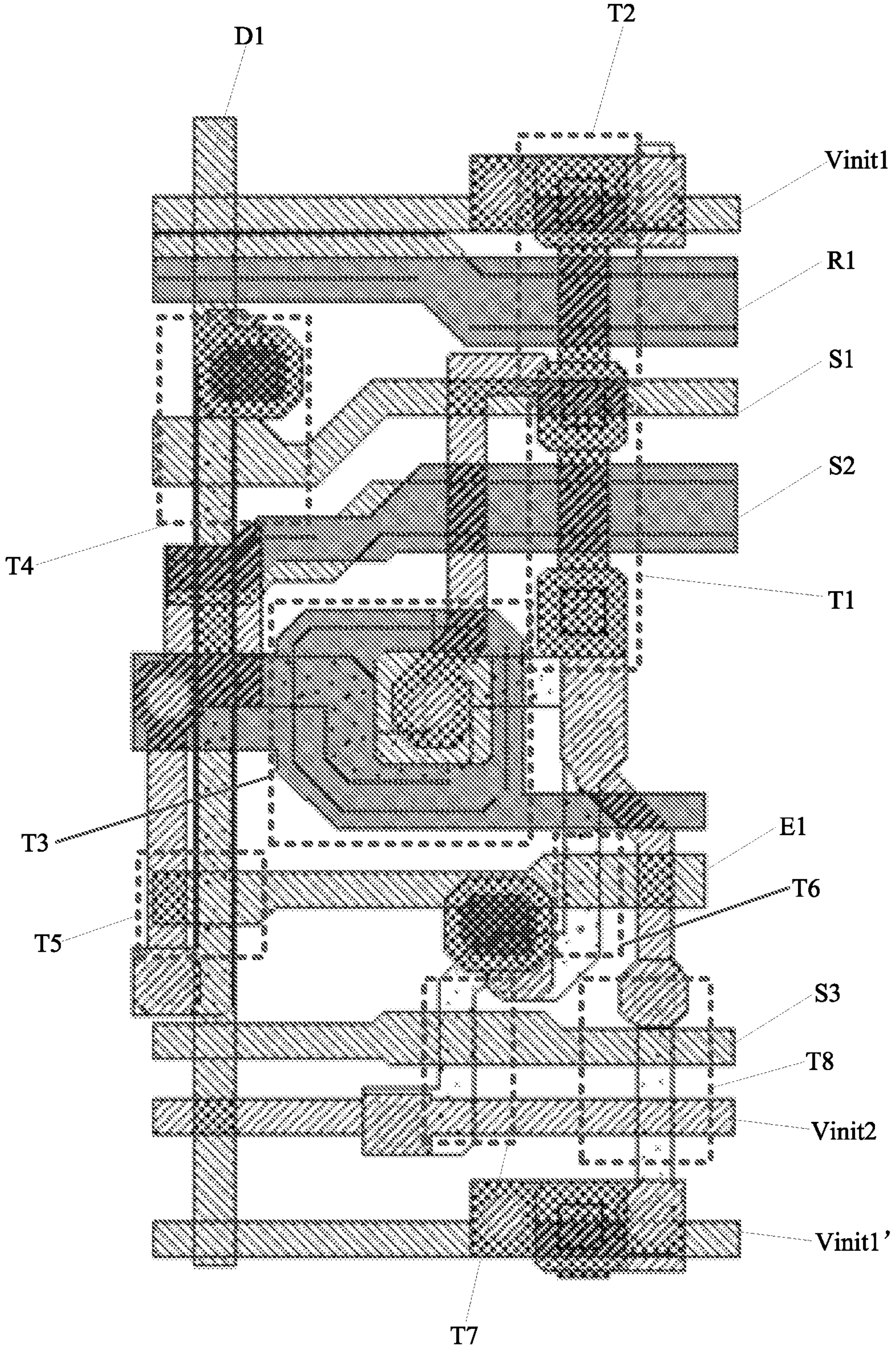
FIG. 30 is a schematic layout diagram corresponding to FIG. 9.
Figure 31:
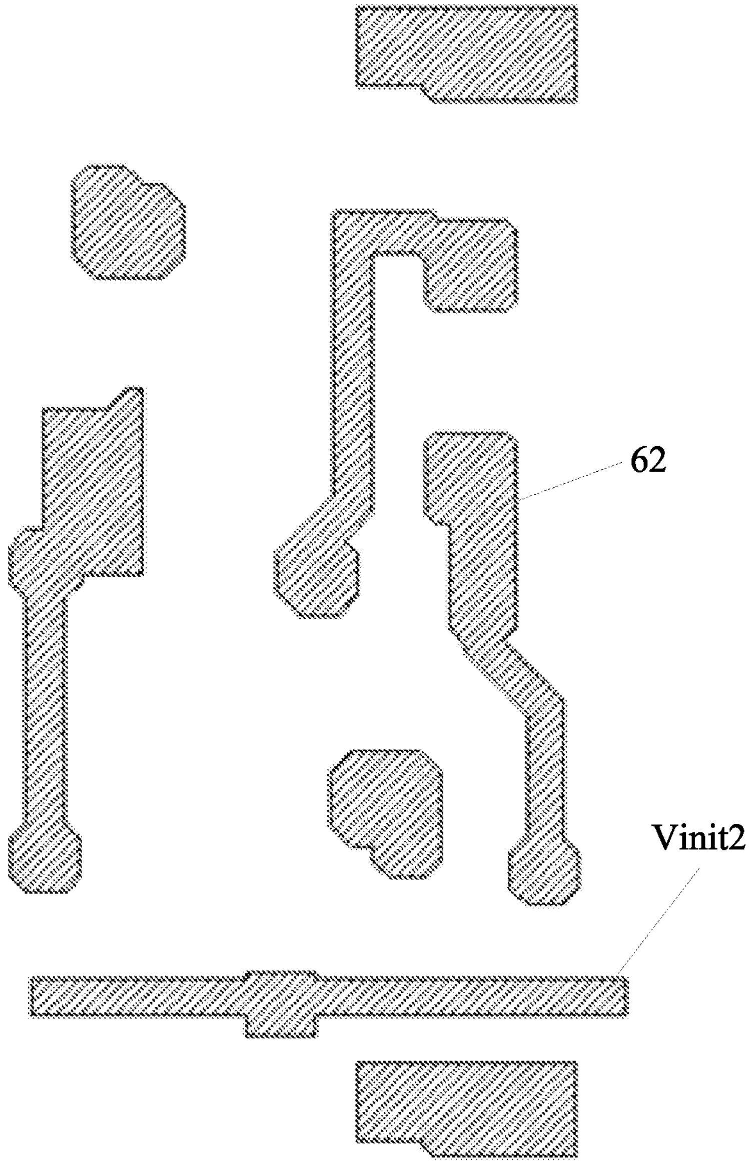
FIG. 31 is a schematic layout diagram of a first source-drain metal layer of FIG. 30.
Figure 32:
FIG. 32 is a schematic layout diagram of a second source-drain metal layer of FIG. 30.

It should be noted that in the embodiments corresponding to FIGS. 23 and 30, some of the single-layer film layers are not illustrated, and reference may be made to the single-layer film layer corresponding to FIG. 11.

The above arrangement is advantageous in reducing the layout difficulty of the sub-pixels.

As shown in FIGS. 11 to 22, in some embodiments, the eighth transistor T8 includes an eighth active layer 58 including at least a portion extending in the first direction.

At least part of an orthographic projection of the eighth active layer 58 onto the base substrate is located between an orthographic projection of the data line D1 onto the base substrate and an orthographic projection of the reset voltage line DR onto the base substrate.

The orthographic projection of the eighth active layer 58 onto the base substrate and an orthographic projection of the gate electrode of the drive transistor onto the base substrate are arranged along the first direction.

Illustratively, the eighth active layer 58 is made by using the poly active layer.

Illustratively, the orthographic projection of the eighth active layer 58 onto the base substrate at least partially overlaps with the orthographic projection of the reset voltage line DR onto the base substrate.

Illustratively, the orthographic projection of the eighth active layer 58 on the base substrate does not overlap the orthographic projection of the data line D1 on the base substrate.

Illustratively, at least part of the orthographic projection of the eighth active layer 58 onto the base substrate is located between an orthographic projection of the light-emitting control line E1 onto the base substrate and an orthographic projection of the second initialization voltage line Vinit2 onto the base substrate.

The above-mentioned arrangement is advantageous for reducing the layout difficulty of the sub-pixels and reducing the parasitic capacitance generated by the eighth transistor T8.

As shown in FIGS. 11 to 22, in some embodiments, the sub-pixel further includes a first conductive connection portion 61, the first conductive connection portion 61 is coupled to a second electrode of the eighth transistor T8 and a first electrode of the third transistor T3.

At least part of an orthographic projection of the first conductive connection portion 61 onto the base substrate is located between an orthographic projection of the data line D1 onto the base substrate and an orthographic projection of the reset voltage line DR onto the base substrate.

Illustratively, the first conductive connection portion 61 is made by using the first source-drain metal layer.

Illustratively, the orthographic projection of the first conductive connection portion 61 onto the base substrate overlaps with the orthographic projection of the data line D1 onto the base substrate, and overlaps with the orthographic projection of the reset voltage line DR onto the base substrate.

Illustratively, the orthographic projection of the first conductive connection portion 61 onto the base substrate does not overlap with the orthographic projection of the data line D1 onto the base substrate, and does not overlap with the orthographic projection of the reset voltage line DR onto the base substrate.

Illustratively, the orthographic projection of the first conductive connection portion 61 onto the base substrate overlaps with the orthographic projection of the light-emitting control line E1 onto the base substrate.

Illustratively, the orthographic projection of the first conductive connection portion 61 onto the base substrate does not overlap with an orthographic projection of a second plate C2 of the storage capacitor C onto the base substrate.

Illustratively, the first conductive connection portion 61 is coupled to the second electrode of the eighth transistor T8 and the first electrode of the third transistor T3 through corresponding via holes.

Illustratively, the first conductive connection portion 61 includes a portion extending in the first direction and a portion extending in a third direction, the third direction intersects with each of the first direction and the second direction.

The above arrangement is advantageous in reducing the layout difficulty of the sub-pixels.

As shown in FIGS. 11 to 22, in some embodiments, the second initialization voltage line Vinit2 includes a body portion, a first protruding portion and a second protruding portion, the body portion includes at least a portion extending in the second direction, and the first protruding portion and the second protruding portion are arranged along the second direction. The second initialization circuit 32 includes a seventh transistor T7, a gate electrode of the seventh transistor T7 is coupled to the third scanning line S3, and a first electrode of the seventh transistor T7 is coupled to the first protruding portion. A first electrode of the eighth transistor T8 is coupled to the second protrusion.

Illustratively, the seventh transistor T7 includes a seventh active layer, the eighth active layer 58 and the seventh active layer are arranged along the second direction. The orthographic projection of the eighth active layer 58 onto the base substrate is located between the orthographic projection of the seventh active layer onto the base substrate and the orthographic projection of the data line D1 onto the base substrate.

As shown in FIGS. 23 to 29, in some embodiments, the driving circuit 11 includes a third transistor T3 and the reset circuit 20 includes an eighth transistor T8.

A gate electrode T8-*g* of the eighth transistor T8 is coupled to the third scanning line S3, a first electrode of the eighth transistor T8 is coupled to the reset voltage line DR, and a second electrode of the eighth transistor T8 is coupled to a second electrode of the third transistor T3.

The reset voltage line DR includes at least a portion extending in the first direction, and the reset voltage line DR and the data line D1 are arranged along the second direction. An orthographic projection of the gate electrode of the driving transistor onto the base substrate is located between an orthographic projection of the data line D1 onto the base substrate and an orthographic projection of the reset voltage line DR onto the base substrate.

Illustratively, the orthographic projection of the gate electrode of the drive transistor onto the base substrate does not overlap with the orthographic projection of the data line D1 onto the base substrate. The orthographic projection of the gate electrode of the drive transistor onto the base substrate does not overlap with the orthographic projection of the reset voltage line DR onto the base substrate.

The above-mentioned arrangement method is not only advantageous for reducing the layout difficulty of the sub-pixels, but also for avoiding the mutual interference between the data line D1 and the reset voltage line DR in the same sub-pixel because the data line D1 and the reset voltage line DR are arranged on two sides of the sub-pixel.

As shown in FIGS. 23 to 29, in some embodiments, the eighth transistor T8 includes an eighth active layer 58 including at least a portion extending in the first direction.

An orthographic projection of the eighth active layer 58 onto the base substrate at least partially overlaps with an orthographic projection of the reset voltage line DR on the base substrate.

Illustratively, the orthographic projection of the eighth active layer 58 onto the base substrate is covered by the orthographic projection of the reset voltage line DR onto the base substrate.

As shown in FIGS. 23 to 29, in some embodiments, the sub-pixel further includes a second conductive connection portion 62, the second conductive connection portion 62 is coupled to the second electrode of the eighth transistor T8 and the second electrode of the third transistor T3.

an orthographic projection of the second conductive connection portion 62 onto the base substrate at least partially overlaps with the orthographic projection of the reset voltage line DR onto the base substrate.

Illustratively, the second conductive connection portion 62 is made by using the first source-drain metal layer.

Illustratively, the second conductive connection portion 62 includes a portion extending in the first direction and a portion extending in the third direction.

Illustratively, the orthographic projection of the second conductive connection portion 62 onto the base substrate overlaps with the orthographic projection of the light-emitting control line E1 onto the base substrate.

Illustratively, the second conductive connection portion 62 is coupled with the second electrode of the eighth transistor T8 and the second electrode of the third transistor T3 through via holes.

Illustratively, the orthographic projection of the second conductive connection portion 62 onto the base substrate partially overlaps with the orthographic projection of the second plate C2 of the storage capacitor C onto the base substrate.

The above arrangement is advantageous for reducing the layout difficulty of the sub-pixels.

As shown in FIGS. 30-32, and 35-39, in some embodiments, the sub-pixel further includes a first initialization voltage line Vinit1, the first initialization voltage line Vinit1 includes at least a portion extending in a second direction. In two adjacent sub-pixels in the first direction, a first initialization voltage line Vinit1' in one sub-pixel is reused as a reset voltage line DR in the other sub-pixel.

Illustratively, the second initialization voltage line Vinit2 is made by using the first source-drain metal layer.

Illustratively, the first initialization voltage line Vinit1 is made by using the first gate metal layer.

Figure 35:
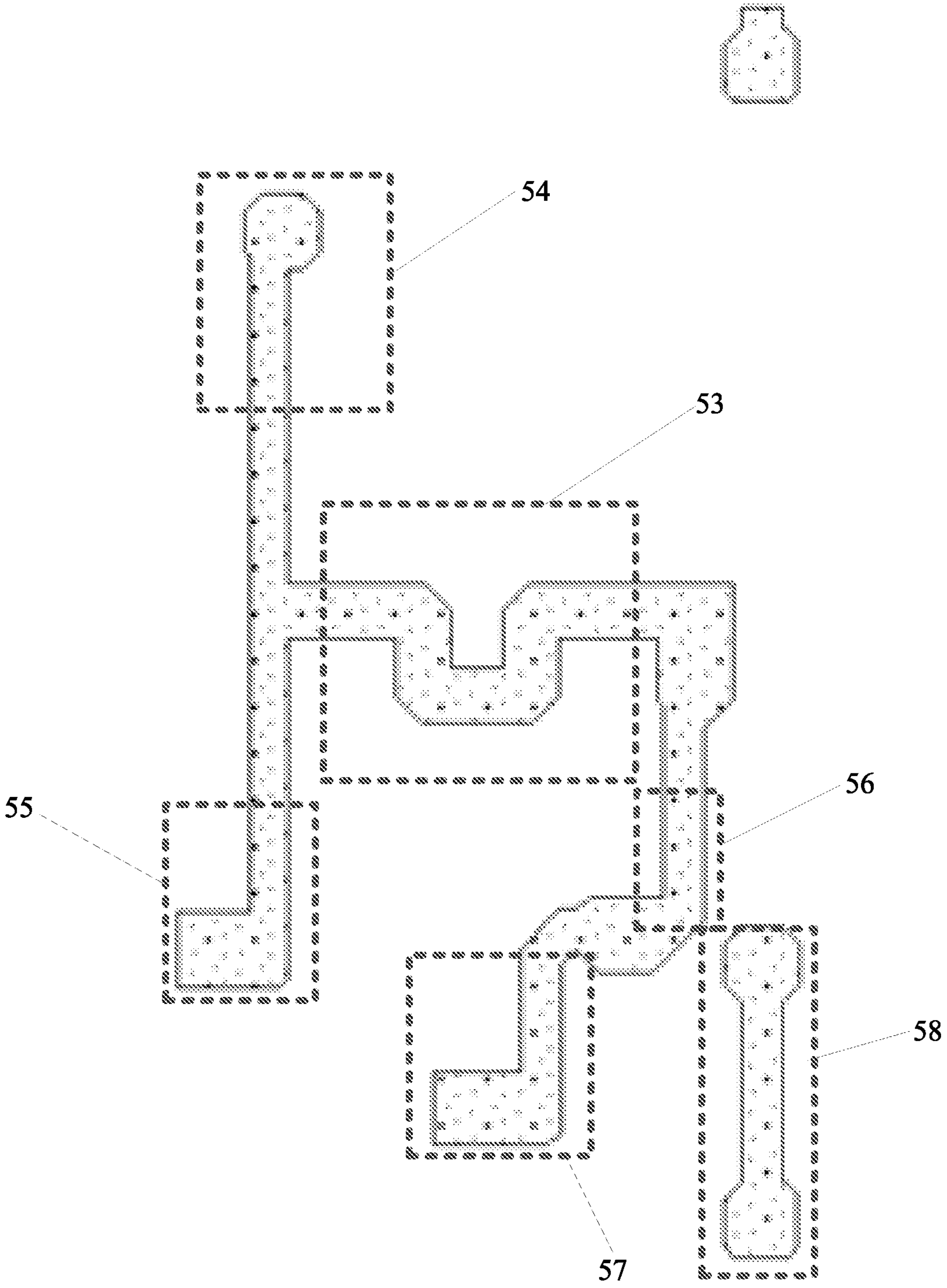
FIG. 35 is a schematic layout diagram of a poly active layer in FIG. 30.
Figure 36:
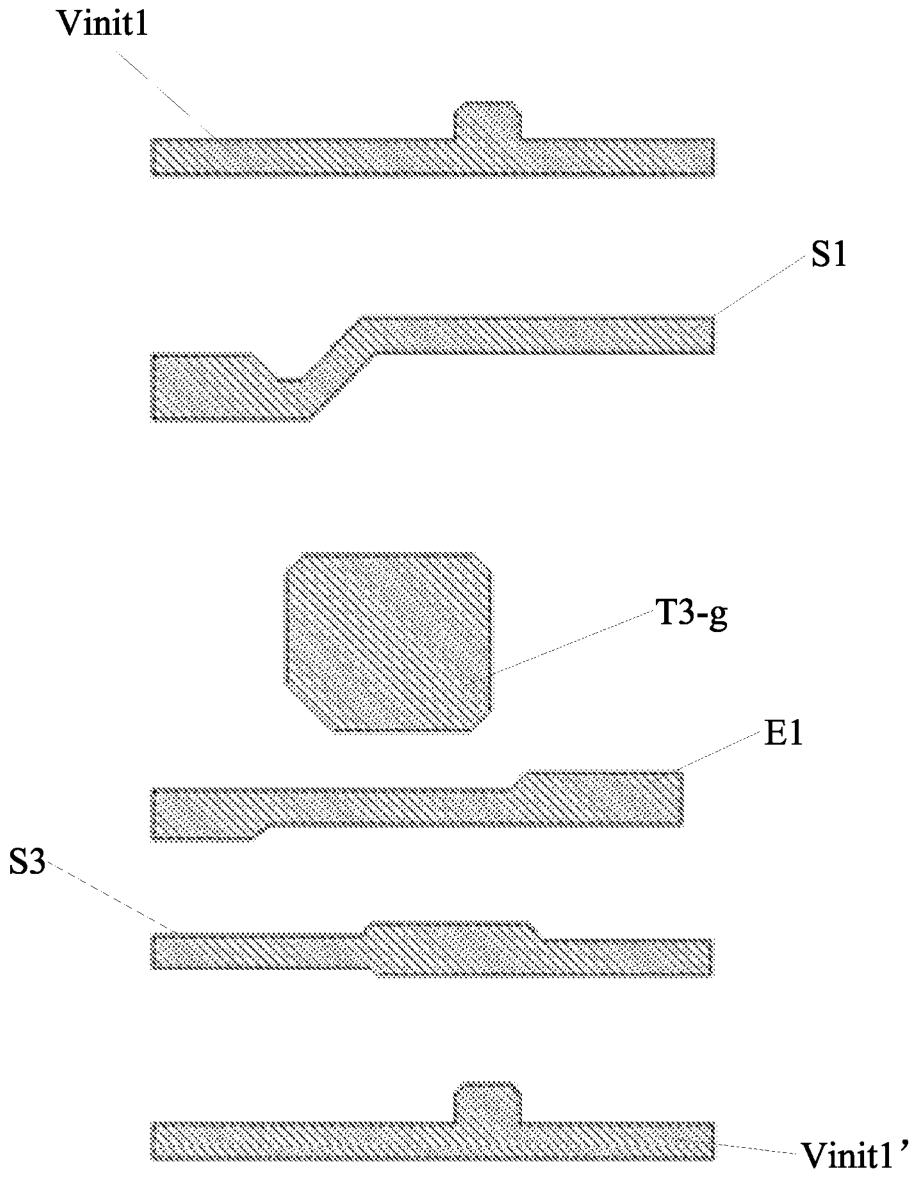
FIG. 36 is a schematic layout diagram of a first gate metal layer in FIG. 30.
Figure 37:
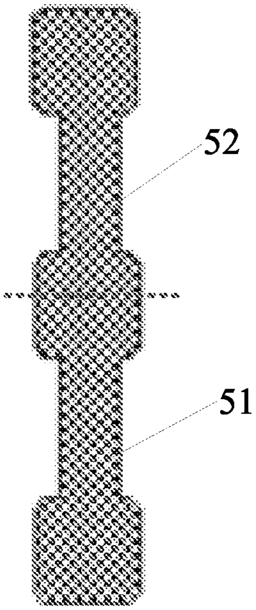
FIG. 37 is a schematic layout diagram of an oxide active layer in FIG. 30.
Figure 37:
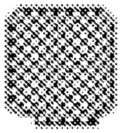
Figure 38:
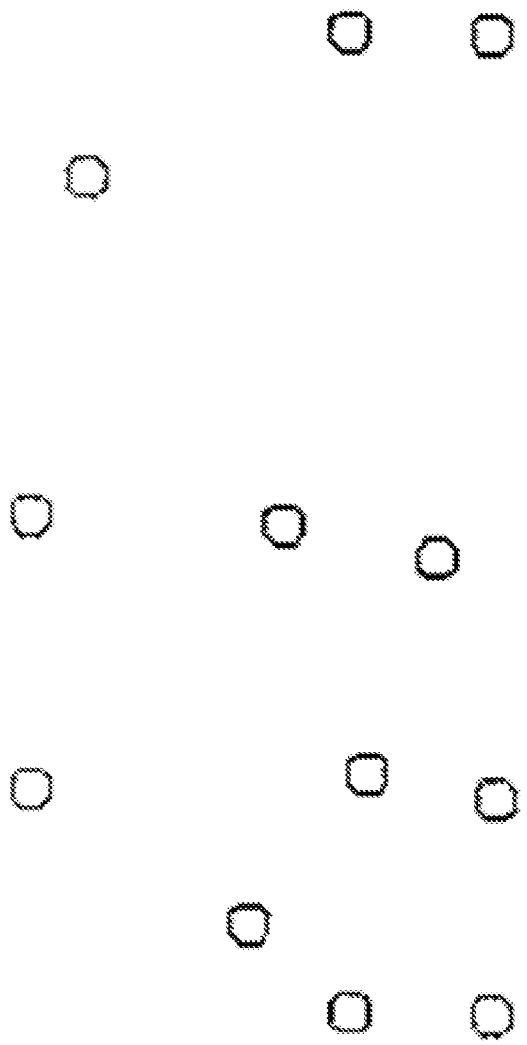
FIG. 38 is a schematic diagram of a first connecting hole in FIG. 30.
Figure 39:
FIG. 39 is a schematic diagram of a second connecting hole in FIG. 30.

It is noted that a separate pattern in the upper right corner of FIG. 35 is a part of an eighth active layer in a previous sub-pixel of sub-pixels adjacent in the first direction. A separate pattern in the bottom of FIG. 37 is a second active layer in a next sub-pixel adjacent in the first direction of the sub-pixels adjacent in the first direction.

With the above-mentioned arrangement, the first initialization voltage line Vinit1' is reused as the reset voltage line DR, and an additional reset voltage line DR dedicated for providing a reset voltage can be omitted, which is advantageous for simplifying the complexity of sub-pixel and the layout difficulty of sub-pixels.

In some embodiments, the second initialization voltage line Vinit2 includes: a first initialization sub-pattern, a second initialization sub-pattern, a third initialization sub-pattern and a third protrusion; the first initialization sub-pattern and the third initialization sub-pattern both extend in the second direction, the first initialization sub-pattern and the third initialization sub-pattern are separated in the first direction, and the first initialization sub-pattern and the third initialization sub-pattern are coupled via the second initialization sub-pattern; the third protrusion is coupled with the third initialization sub-pattern. The second initialization circuit 32 includes a seventh transistor T7, a gate electrode of the seventh transistor T7 is coupled to the third scanning line S3, and a first electrode of the seventh transistor T7 is coupled to the first initialization sub-pattern. The first electrode of the eighth transistor T8 is coupled to the third protrusion.

Illustratively, the seventh transistor T7 includes a seventh active layer, an orthographic projection of the seventh active layer onto the base substrate is located between the orthographic projection of the data line D1 onto the base substrate and the orthographic projection of the reset line onto the base substrate.

Illustratively, the orthographic projection of the seventh active layer onto the base substrate is located between the orthographic projection of the data line D1 onto the base substrate and the orthographic projection of the eighth active layer 58 onto the base substrate.

Figure 14:
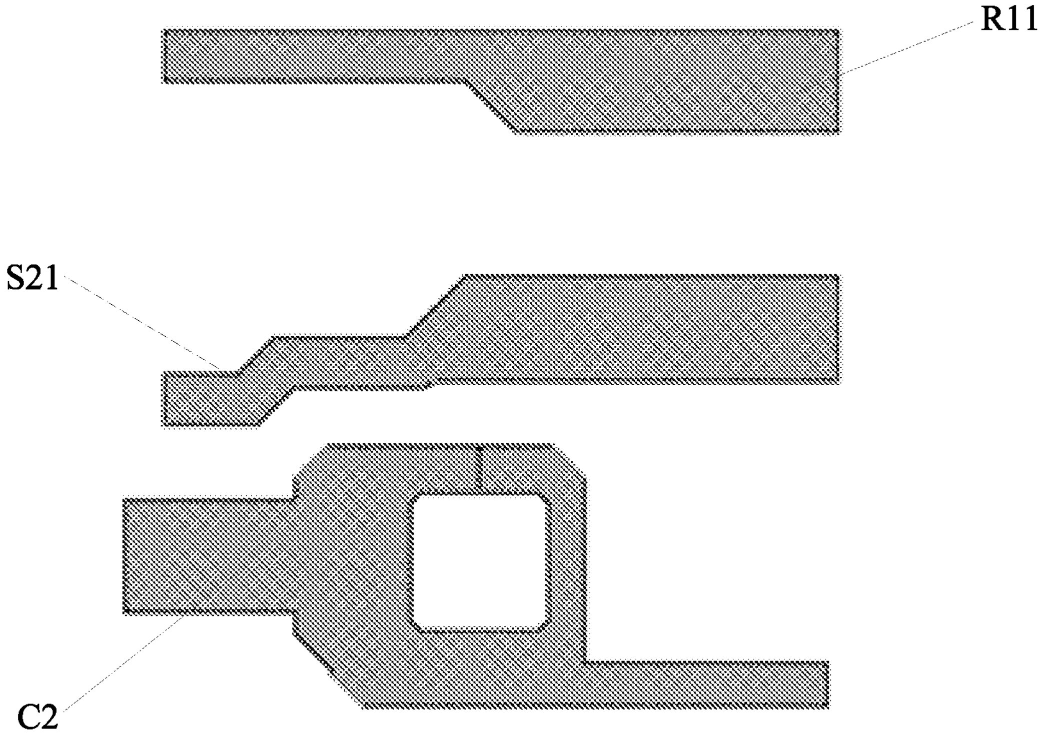
FIG. 14 is a schematic layout diagram of a second gate metal layer in FIG. 11.
Figure 16:
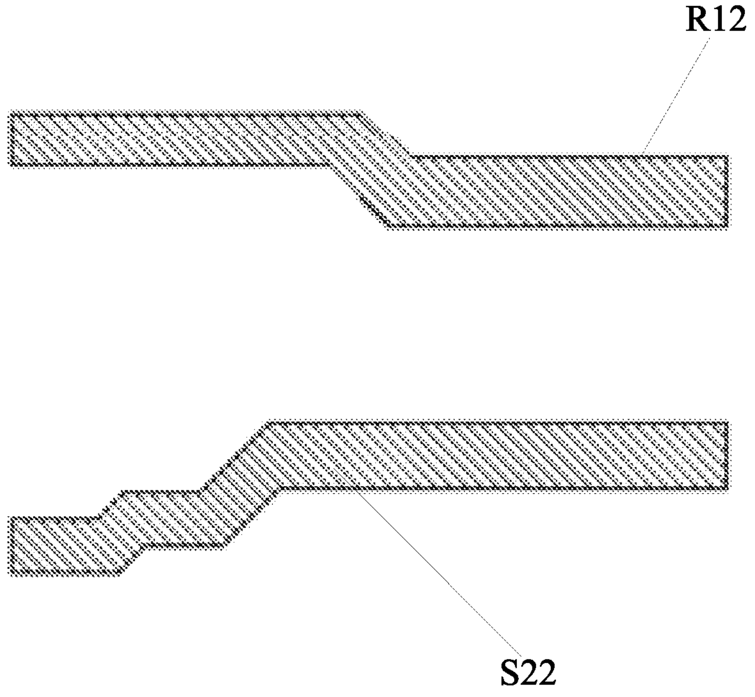
FIG. 16 is a la schematic layout diagram of a third gate metal layer in FIG. 11.

As shown in FIGS. 11, 14 and 16, in some embodiments, the sub-pixel further includes a second scanning line S2, the second scanning line S2 includes a first scanning sub-pattern S21 and a third scanning sub-pattern S22, at least part of the first scanning sub-pattern S21 and at least part of the third scanning sub-pattern S22 both extend in the second direction.

The compensation control circuit 13 includes a first transistor T1, where the first transistor T1 includes a first oxide active layer; at least part of the first oxide active layer is located between the first scanning sub-pattern and the third scanning sub-pattern in a direction perpendicular to the base substrate.

Illustratively, the first scanning sub-pattern is made by using the second gate metal layer and the third scanning sub-pattern is made by using the third gate metal layer. At least part of the first scanning sub-pattern is located between the base substrate and the third scanning sub-pattern.

As shown in FIGS. 11, 14 and 16, in some embodiments, the sub-pixel further includes an initialization control line R1, the initialization control line R1 includes a first initialization sub-pattern R11 and a second initialization sub-pattern R12, at least part of the first initialization sub-pattern R11 and at least part of the second initialization sub-pattern R12 both extend in the second direction;

The first initialization circuit 14 includes a second transistor T2, wherein the second transistor T2 includes a second oxide active layer; at least part of the second oxide active layer is located between the first initialization sub-pattern and the second initialization sub-pattern in a direction perpendicular to the base substrate.

Illustratively, the first initialization sub-pattern is made by using a second gate metal layer and the second initialization sub-pattern is made using a third gate metal layer. At least part of the first initialization sub-pattern is located between the base substrate and the second initialization sub-pattern.

As shown in FIG. 15, in some embodiments, the first oxide active layer (e.g., denoted by reference sign 51) and the second oxide active layer (e.g., denoted by reference numeral 52) are arranged along the first direction.

The data writing circuit 41 includes a fourth transistor T4, the fourth transistor T4 includes a fourth active layer, an orthographic projection of the fourth active layer onto the base substrate at least partially overlaps with an orthographic projection of the data line D1 onto the base substrate, the fourth active layer and the first oxide active layer are arranged along the second direction.

In some embodiments, the sub-pixel further includes a light-emitting control line E1, the light-emitting control line E1 includes at least a portion extending in the second direction.

The light-emitting control circuit 31 includes a fifth transistor T5 and a sixth transistor T6, where a gate electrode of the fifth transistor T5 is coupled to the light-emitting control line E1, and a gate electrode of the sixth transistor T6 is coupled to the light-emitting control line E1.

The fifth transistor T5 includes a fifth active pattern and the sixth transistor T6 includes a sixth active pattern, the fifth active pattern and the sixth active pattern are arranged along the second direction.

Embodiments of the present disclosure further provide a display device, including the display substrate provided by the above embodiments.

Since in the display substrate provided by the above-mentioned embodiments, by providing the reset circuit 20, it is possible to apply a bias voltage having an opposite sign to that of the light-emitting phase P4 to the driving circuit 11 in the bias compensation phase P2, the characteristics shift of the driving circuit when being operated at a certain bias voltage for a certain time period can be compensated for, and the short-term residual image and the slow response can be improved. Moreover, when driving at a low frequency, it is possible to compensate for the difference in luminance caused by the characteristic shift of the driving circuit 11 during a long-time light-emitting phase, thereby improving the Flicker phenomenon. Therefore, in a case that the display device provided by the embodiments of the present disclosure includes the above-mentioned display substrate, the above-mentioned advantageous effects can also be achieved, and the description thereof will not be repeated here.

In addition, when the display device provided in the embodiments of the present disclosure includes the above-mentioned display substrate, it is possible to perform a bias compensation specific to the driving circuit 11 in each pixel circuit in the display substrate, thereby realizing a good compensation effect. Furthermore, since the reset voltage provided by the reset voltage line DR can be independently adjusted, an appropriate bias voltage can be provided to each pixel circuit in the display substrate as needed.

It is to be noted that the display device may be any product or component with a display function, such as a television, a display, a digital photo frame, a mobile phone, a tablet computer, and among others, the display device further includes a flexible circuit board, a printed circuit board and a back panel.

It is to be noted that the “same layer” in the embodiments of the present disclosure may refer to a film layer on the same structural layer. Or, for example, the film layer in the same layer may be a layer structure formed by forming a film layer having a specific pattern by using the same film forming process and then patterning the film layer by one patterning process using the same mask plate. Depending on the specific pattern, a single patterning process may include multiple exposures, developments, or etching processes. The specific pattern in the resulting layer structure may or may not be continuous. The specific patterns may have different heights or have different thicknesses.

In the various method embodiments of the present disclosure, the serial number of each step cannot be used to define the order of each step, and for a person of ordinary skill in the art, without involving any inventive effort, changes in the order of each step are also within the scope of the present disclosure.

It should be noted that the various embodiments described herein are described in a progressive manner. The same or similar parts can be referred to each other throughout the various embodiments, with each embodiment focusing on differences from the other embodiments. In particular, the method embodiments are described more simply because they are substantially similar to the product embodiments, with reference to the partial description of the product embodiments.

Unless defined otherwise, technical or scientific terms used in this disclosure shall have the ordinary meaning as understood by one of ordinary skill in the art to which this disclosure belongs. The terms “first”, “second”, and the like as use herein do not denote any order, quantity, or importance, but rather are used to distinguish one element from another. The terms “include” or “comprise”, and the like, means that the presence of an element or item preceding the word covers the presence of the element or item listed after the word and equivalents thereof, but does not exclude other elements or items. The terms “connect”, “couple” or “connected” and the like are not limited to a physical or mechanical connection, but may include an electrical connection, whether direct or indirect. The terms “upper”, “lower”, “left”, “right” and the like are used only to indicate relative positional relationships that may change accordingly when the absolute position of the object being described changes.

It will be understood that when an element such as a layer, film, region or substrate is referred to as being “on” or “under” another element, it can be “directly on” or “directly under” the other element or intervening elements may be present therebetween.

In the description of the embodiments above, particular features, structures, materials, or characteristics may be combined in any suitable manner in any one or more embodiments or examples.

The forging describes a specific implementation of the present disclosure, but the protection scope of the present disclosure is not limited thereto. Changes or substitutions, which would be readily conceived by those skilled in the art with the technical teaching of the present disclosure, fall within the protection scope of the present disclosure. Therefore, the protection scope of the present disclosure is set forth in the appended claims.

What is claimed is:

1. A pixel circuit, comprising: a driving circuit, a data writing circuit and a reset circuit, wherein the data writing circuit is coupled to a first scanning line, a data line and a second terminal of the driving circuit, and the data writing circuit is configured to control a connection between the data line and the second terminal of the driving circuit under control of a first scanning signal provided by the first scanning line;

the reset circuit is coupled to a third scanning line, a reset voltage line and the second terminal of the driving circuit, and the reset circuit is configured to: control, in a bias compensation phase under control of a third scanning signal provided by the third scanning line, the reset voltage line to be connected to the second terminal of the driving circuit without being connected to a control terminal of the driving circuit; or the reset circuit is coupled to the third scanning line, the reset voltage line and a first terminal of the driving circuit, and the reset circuit is configured to: control, in the bias compensation phase under control of the third scanning signal, the reset voltage line to be connected to the first terminal of the driving circuit without being connected to the control terminal of the driving circuit; and the driving circuit is configured to control a connection between the first terminal of the driving circuit and the second terminal of the driving circuit under control of a potential of the control terminal of the driving circuit;

wherein the pixel circuit further comprises: a compensation control circuit, a first initialization circuit, a light-emitting control circuit, an energy storage circuit and a light-emitting element;

the compensation control circuit is electrically connected to a second scanning line, the control terminal of the driving circuit and the first terminal of the driving circuit, and the compensation control circuit is configured to control a connection between the control terminal of the driving circuit and the first terminal of the driving circuit under control of a second scanning signal provided by the second scanning line;

the first initialization circuit is coupled to an initialization control line, a first initialization voltage line and the control terminal of the driving circuit, the first initialization circuit is configured to control a connection between the first initialization voltage line and the control terminal of the driving circuit under control of an initialization control signal provided by the initialization control line;

the light-emitting control circuit is coupled to a light-emitting control line, the first terminal of the driving circuit and the light-emitting element, and the light-emitting control circuit is configured to control a connection between the first terminal of the driving circuit and the light-emitting element under control of a light-emitting control signal provided by the light-emitting control line;

the energy storage circuit is coupled to the control terminal of the driving circuit and the second terminal of the driving circuit; and the first initialization voltage line is reused as the reset voltage line.

2. The pixel circuit according to claim 1, wherein the pixel circuit further comprises: a second initialization circuit; and the second initialization circuit is coupled to the third scanning line, a second initialization voltage line and the light-emitting element, and the second initialization circuit is configured to control a connection between the second initialization voltage line and the light-emitting element under control of the third scanning signal.

3. The pixel circuit according to claim 1, wherein the light-emitting control circuit is further coupled to a first voltage line and the second terminal of the driving circuit, and the light-emitting control circuit is configured to control a connection between the first voltage line and the second terminal of the driving circuit under control of the light-emitting control signal.

4. The pixel circuit according to claim 3, wherein the compensation control circuit comprises a first transistor, the first initialization circuit comprises a second transistor, the driving circuit comprises a third transistor, and the light-emitting control circuit comprises a fifth transistor and a sixth transistor;

a gate electrode of the first transistor is coupled to the second scanning line, a first electrode of the first transistor is coupled to a second electrode of the third transistor, and a second electrode of the first transistor is coupled to a gate electrode of the third transistor;

a gate electrode of the second transistor is coupled to the initialization control line, a first electrode of the second transistor is coupled to the first initialization voltage line, and a second electrode of the second transistor is coupled to the gate electrode of the third transistor;

a gate electrode of the fifth transistor is coupled to the light-emitting control line, a first electrode of the fifth transistor is coupled to the first voltage line, and a second electrode of the fifth transistor is coupled to a first electrode of the third transistor; and a gate electrode of the sixth transistor is coupled to the light-emitting control line, a first electrode of the sixth transistor is coupled to the second electrode of the third transistor, and a second electrode of the sixth transistor is coupled to the light-emitting element.

5. The pixel circuit according to claim 4, wherein the first transistor and the second transistor are oxide thin-film transistors.

6. The pixel circuit according to claim 2, wherein the second initialization circuit comprises a seventh transistor, and a gate electrode of the seventh transistor is coupled to the third scanning line, a first electrode of the seventh transistor is coupled to the second initialization voltage line, and a second electrode of the seventh transistor is coupled to the light-emitting element.

7. The pixel circuit according to claim 1, wherein the data writing circuit comprises a fourth transistor, and the reset circuit comprises an eighth transistor;

a gate electrode of the fourth transistor is coupled to the first scanning line, a first electrode of the fourth transistor is coupled to the data line, and a second electrode of the fourth transistor is coupled to a first electrode of a third transistor;

a gate electrode of the eighth transistor is coupled to the third scanning line, a first electrode of the eighth transistor is coupled to the reset voltage line, and a second electrode of the eighth transistor is coupled to the first electrode of the third transistor or a second electrode of the third transistor.

8. A driving method, applied to the pixel circuit according to claim 1, a display period comprising a write compensation phase and the bias compensation phase, the driving method comprising:

in the write compensation phase, controlling, by the data writing circuit under control of the first scanning signal, the connection between the data line and the second terminal of the driving circuit; and in the bias compensation phase, controlling, by the reset circuit under control of the third scanning signal, the reset voltage line to be connected to the second terminal of the driving circuit without being connected to the control terminal of the driving circuit; or, controlling, by the reset circuit under control of the third scanning signal, the reset voltage line to be connected to the first terminal of the driving circuit without being connected to the control terminal of the driving circuit.

9. The driving method according to claim 8, wherein the display period further comprises an initialization phase and a light-emitting phase;

in the initialization phase, controlling, by a first initialization circuit in the pixel circuit under control of an initialization control signal, a connection between a first initialization voltage line and the control terminal of the driving circuit;

in the write compensation phase, controlling, by a compensation control circuit in the pixel circuit under control of a second scanning signal, a connection between the control terminal of the driving circuit and the first terminal of the driving circuit; and in the light-emitting phase, controlling, by a light-emitting control circuit in the pixel circuit under control of a light-emitting control signal, a connection between a first voltage line and the second terminal of the driving circuit and a connection between the first terminal of the driving circuit and the light-emitting element, to cause the driving circuit to drive the light-emitting element to emit light.

10. The driving method according to claim 8, wherein the display period further comprises a plurality of light-emitting phases and a plurality of bias compensation phases, the plurality of light-emitting phases and the plurality of bias compensation phases being alternately arranged.

* * * * *